United States Patent
Forrest et al.

(10) Patent No.: US 6,795,622 B2
(45) Date of Patent: Sep. 21, 2004

(54) PHOTONIC INTEGRATED CIRCUITS

(75) Inventors: Stephen R. Forrest, Princeton, NJ (US); Milind R. Gokhale, Princeton, NJ (US); Fengnian Xia, Princeton, NJ (US); Vinod Menon, Lawrenceville, NJ (US)

(73) Assignee: The Trustess of Princeton University

( * ) Notice: Subject to any disclaimer, the term of this patent is extended or adjusted under 35 U.S.C. 154(b) by 251 days.

(21) Appl. No.: 10/163,436

(22) Filed: Jun. 4, 2002

(65) Prior Publication Data

US 2003/0007719 A1 Jan. 9, 2003

Related U.S. Application Data

(63) Continuation-in-part of application No. 09/982,001, filed on Oct. 18, 2001, which is a continuation of application No. 09/337,785, filed on Jun. 22, 1999, now Pat. No. 6,381,380.
(60) Provisional application No. 60/090,451, filed on Jun. 24, 1998.

(51) Int. Cl.[7] .................................................. G02B 6/26
(52) U.S. Cl. ............................................. 385/50; 372/6
(58) Field of Search ........................... 385/14, 28, 37, 385/50, 130; 372/6, 20, 45, 44, 50; 359/344

(56) References Cited

U.S. PATENT DOCUMENTS

| | | | |
|---|---|---|---|
| 5,039,189 A | 8/1991 | Lytel et al. ..................... 385/2 |
| 5,078,516 A | 1/1992 | Kapon et al. ................ 385/129 |
| 5,140,149 A | 8/1992 | Sakata et al. ............. 250/211 J |
| 5,208,878 A | 5/1993 | Thulke ......................... 385/14 |
| 5,325,379 A | 6/1994 | Amann ......................... 372/20 |
| 5,355,386 A | 10/1994 | Rothman et al. ............. 372/50 |
| 5,499,259 A | 3/1996 | Makita ......................... 372/45 |
| 5,509,094 A | 4/1996 | Minami et al. ............... 385/29 |
| 5,511,084 A | 4/1996 | Amann ......................... 372/20 |
| 5,568,311 A | 10/1996 | Matsumoto .................. 359/344 |
| 5,623,363 A | 4/1997 | Liou ........................... 359/344 |
| 5,663,824 A | 9/1997 | Koch et al. .................. 359/184 |
| 5,708,671 A * | 1/1998 | Siao et al. .................... 372/20 |
| 5,721,750 A | 2/1998 | Kwon et al. .................. 372/44 |
| 5,852,687 A | 12/1998 | Wickham ...................... 385/14 |
| 5,859,866 A | 1/1999 | Forrest et al. ................ 372/50 |
| 5,917,967 A | 6/1999 | Dubey et al. ................. 385/14 |
| 5,985,685 A | 11/1999 | Lealman et al. ............. 438/31 |
| 6,051,445 A | 4/2000 | Dubey et al. ................. 438/31 |
| 6,167,073 A | 12/2000 | Botez et al. ................. 372/46 |
| 6,198,863 B1 | 3/2001 | Lealman et al. ............. 385/37 |
| 6,215,295 B1 * | 4/2001 | Smith, III .................... 324/95 |
| 6,240,233 B1 | 5/2001 | Weinert et al. ............. 385/131 |

(List continued on next page.)

FOREIGN PATENT DOCUMENTS

GB 2 105 863 A 3/1983
WO WO 99/67665 12/1999

OTHER PUBLICATIONS

Copy of the PCT International Search Report dated Sep. 15, 2003 (PCT/US03/17510).

(List continued on next page.)

*Primary Examiner*—Akm Enayet Ullah
(74) *Attorney, Agent, or Firm*—Woodcock Washburn LLP

(57) ABSTRACT

A photonic integrated circuit comprises a first waveguide with a first mode of light propagating therein and a second waveguide with a second mode of light propagating therein. The first and second modes of light have different effective indices of refraction. A taper formed in the second waveguide facilitates communication of light between waveguides. Each of the first and second waveguides operate to perform at least one of the generating light, detecting light, and transporting light.

45 Claims, 16 Drawing Sheets

U.S. PATENT DOCUMENTS

| | | | |
|---|---|---|---|
| 6,310,995 B1 | 10/2001 | Saini et al. | 385/28 |
| 6,311,003 B1 | 10/2001 | Dubey et al. | 385/130 |
| 6,314,117 B1 | 11/2001 | Heim et al. | 709/203 |
| 6,330,378 B1 | 12/2001 | Forrest et al. | 385/14 |
| 6,335,994 B1 * | 1/2002 | Kato | 385/50 |
| 6,339,496 B1 | 1/2002 | Koley et al. | 359/344 |
| 6,381,380 B1 | 4/2002 | Forrest et al. | 385/14 |

OTHER PUBLICATIONS

Studenkov, P.V., et al., "Efficient Coupling in Integrated Twin–Waveguide Lasers Using Waveguide Tapers", *IEEE Photonics Technology Letters*, vol. 11, No. 9, pp. 1096–1098, (1999).

Studenkov, P.V., et al., "Asymmetric Twin–Waveguide 1.55–µm Wavelength Laser with a Distributed Bragg Reflector", *IEEE Photonics Technology Letters*, vol. 12, No. 5, pp. 468–470, (2000).

Studenkov, P.V., et al., "Monolithic Integration of a Quantum–Well Laser and an Optical Amplifier Using an Asymmetric Twin–Waveguide Structure", *IEEE Photonics Technology Letters*, vol. 10, No. 8, pp. 1088–1090, (1998).

Dagenais, M., et al., "Alignment tolerant lasers and silicon waferboard integration," *Passive Alignment Techniques for Optoelectronic Transmitter Arrays*, http:www.ee.umd.edu/photonics/papers/spie/SPIE97.htm, 1997, 6 pages (no date).

Dagenais, M., et al., "complex needs drive optoelectronic integration," *Optoelectronics World*, Jul. 1998, 157–160 (no date).

Fredkin, E., et al., "Conservative Logic," *Int. J. Theor. Phys.*, 1982, 21(3/4), 219–253.

Saini, S.S., et al., "Compact mode expanded lasers using resonant coupling between a 1.55–µm InGaAsP tapered active region and an underlying coupling waveguide," *IEEE Photonics Technology Letters*, Sep. 1998, 10(9), 3 pages (no date).

Vusirikala, V., et al., "1.55–µm InGaAsP—InP laser arrays with integrated–mode expanders fabricated using a single epitaxial growth," *IEEE J. Selected Topics in Quantum Electronics*, Dec. 1997, 3(6), 1332–1343 (no date).

U.S. patent application Ser. No. 09/891,639, Forrest et al., filed Jun. 26, 2001.

U.S. patent application Ser. No. 09/982,001, Forrest et al., filed Oct. 18, 2001.

Copy of the Supplementary European Search Report dated Feb. 6, 2004 (EP 01 93 5136).

Bauer, J.G., et al., "High responsivity integrated tapered waveguide PIN photodiode," *Proceedings fo the European Conference on Optical Communication (ECOC)*, Sep. 12–16, 1993, vol. 2, Conf,. 19, 277–280.

Saini, S.S., et al., "Compact low–loss vertical resonant mode coupling between two well–confined waveguides," *Electronics Letts.*, 1999, 35(14), 2 pages.

Saini, S.S., et al., "Passive active resonant coupler (PARC) platform with mode expander," *IEEE Photonics Techn. Letts.*, 2000, 12(8), 1025–1027.

\* cited by examiner

| C | A | B | C' | A' | B' |
|---|---|---|----|----|----|
| 0 | 0 | 0 | 0  | 0  | 0  |
| 0 | 0 | 1 | 0  | 1  | 0  |
| 0 | 1 | 0 | 0  | 0  | 1  |
| 0 | 1 | 1 | 0  | 1  | 1  |
| 1 | 0 | 0 | 1  | 0  | 0  |
| 1 | 0 | 1 | 1  | 0  | 1  |
| 1 | 1 | 0 | 1  | 1  | 0  |
| 1 | 1 | 1 | 1  | 1  | 1  |

FIGURE 8

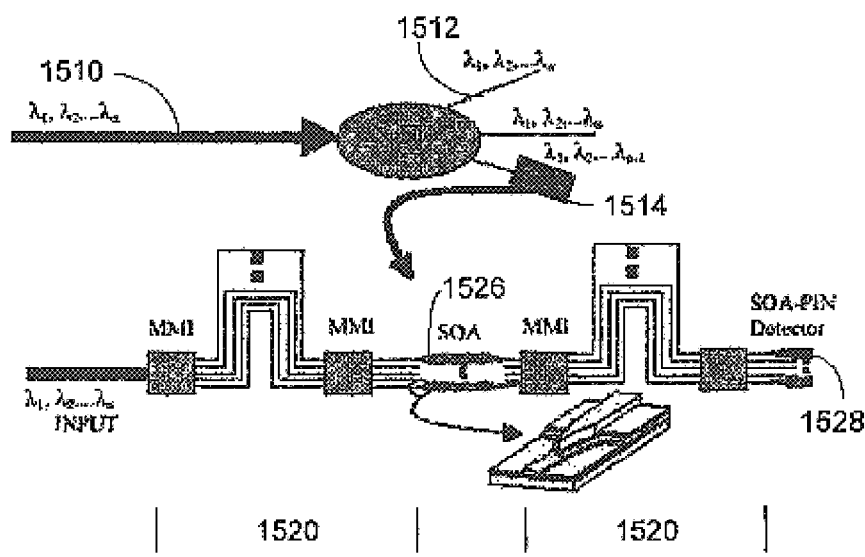

PHOTONIC INTEGRATED CIRCUITS

CROSS REFERENCE TO RELATED APPLICATIONS

The present application is a continuation-in-part of U.S. patent application Ser. No. 09/982,001 filed Oct. 18, 2001, entitled "Twin Waveguide Based Design for Photonic Integrated Circuits," which is a continuation of U.S. patent application Ser. No. 09/337,785 filed Jun. 22, 1999, entitled "Twin Waveguide Based Design for Photonic Integrated Circuits," now U.S. Pat. No. 6,381,380, which claimed priority to U.S. Provisional Application serial No. 60/090,451 filed Jun. 24, 1998, entitled "Twin Waveguide Based Design for Photonic Integrated Circuits," the contents of all of which are hereby incorporated in their entirety.

GOVERNMENT LICENSE RIGHTS

The U.S. Government has a paid-up license in this invention and the right in limited circumstances to require the patent owner to license others on reasonable terms as provided for by the terms of contract number DAAD19-00-1-0415 awarded by the U.S. Army.

FIELD OF THE INVENTION

The present invention relates generally to the field of photonics, and more particularly to photonic integrated circuits (PICs).

BACKGROUND

The field of photonics has long been touted as having the capacity to revolutionize telecommunications and computing, and to a limited extent, it has delivered on its promise. Indeed, discrete optical devices such as lasers and photodetectors have been developed and greatly increased the capacity of telecommunications systems. Nevertheless, many advances expected of photonic technology have yet to materialize. Notably, photonic integrated circuit (PIC) technology has been slow to develop. Generally, a PIC is a combination of photonic devices in a circuit on a single substrate to achieve a desired function. For example, a PIC may comprise lasers, receivers, waveguides, detectors, semiconductor optical amplifiers (SOA), gratings, and other active and passive semiconductor optical devices on a single substrate. While discrete photonic devices are extremely valuable in their own right, many of the great improvements heralded by photonics can become reality only through the combination of photonic devices in PICs. Despite the benefits expected of PICs, a truly versatile and robust technology for implementing them has not previously been developed.

To date, many photonic integration technologies have been pursued to greater or lesser success. Of the demonstrated methods for forming PICs, the most versatile have been selective area regrowth, selective area growth, and quantum well intermixing. Selective area regrowth technologies are the most sophisticated, with considerable effort dedicated to engineering complex, tunable wave division multiplexing (WDM) sources for fiber optic networks. While these tunable lasers exhibit very high performance, including broad wavelength tunability, temperature stability, and pure spectral emission, they nevertheless require several regrowth steps (on the order of approximately 5 to 7), with precise layer etching of vertical tapers and gratings between each growth. Furthermore, the fabrication steps employed after the multiple growths add significant complexity and cost to the finished chip. Hence, while performance characteristics of such a device (excluding cost) are suitable for sophisticated applications such as wave division multiplexing (WDM), it is unlikely that selective area regrowth processes can be mastered by more than one or two highly specialized laboratories. This suggests that the process will not ultimately result in the rapid design and deployment of the broad range of low cost components demanded by the rapidly expanding digital and analog WDM system architectures. In effect, each selective area re-growth structure must be specialized for a particular application. This increases the design cycle and chip costs to the extent that the integration technology becomes the bottleneck in pacing the growth and deployment of WDM systems.

In contrast, quantum well (QW) intermixing technology lends itself to more rapid demonstration of photonic devices. In this technology area, multi quantum wells (MQWs) are locally disordered by diffusion to create a new alloy whose bandgap is blue-shifted with respect to the MQW light-generating region. While conceptually simple, this technique is rather limited in its scope in that it is used primarily for integrating lasers and waveguide-like structures. Its utility for realizing more complex PICs (incorporating detectors, low voltage modulators, or tunable lasers, for example) is considerably less promising, and hence cannot be widely used for many components unique to WDM architectures. Further, quantum well intermixing has been used primarily for AlGaAs/GaAs systems, and is considerably less mature for InGaAsP-based devices widely used for long wavelength optical communications applications.

Selective area growth, where quantum well dimensions are determined by the width of stripes pre-etched in a growth mask (such as silicon nitride), has similar limitations to those experienced by quantum well intermixing. While growth in wide regions results in red shifting of the effective bandgap of the MQW compared to that grown in narrow regions, this process confines the design only to those devices with equal numbers of QWs. However, a modulator section tends to operate best with 5–10 QWs, while lasers require 1–3 QWs to maximize gain while minimizing threshold current. Once again, this represents a simple but limited approach to integration.

Thus, existing methods for designing and fabricating photonic integrated circuits have significant limitations. Accordingly, there is a need for integration technologies that are robust, truly versatile, and easily implemented on a large scale.

SUMMARY

Applicants disclose herein improved photonic integrated circuits. More particularly, disclosed herein are PICs integrated according to asymmetric twin guide (ATG) design principles. In U.S. patent application Ser. No. 09/982,001, filed on Oct. 18, 2001, entitled "Twin Waveguide Based Design for Photonic Integrated Circuits," the contents of which are hereby incorporated by reference in their entirety, there is disclosed a modified twin guide (TG) structure, referred to as an asymmetric twin waveguide (ATG), which addresses many of the performance problems commonly associated with conventional TG structures. The ATG design significantly reduces modal interference by substantially confining different modes of light to propagation in different waveguides. This is accomplished in part by designing the waveguides that are comprised in the twin waveguide structure such that the mode of light that primarily propagates in each waveguide has a different effective index of refraction.

The asymmetric waveguides may be laterally tapered to reduce coupling losses by resonant or adiabatic coupling of the optical energy between the first and second waveguide. The asymmetric waveguide design significantly reduces interaction between optical modes and thereby allows for specialization of waveguides to form optical devices.

The ATG design is a versatile platform and has resulted in the development of photonic devices suitable for large-scale commercial use. For example, in U.S. patent application Ser. No. 09/717,851, filed on Nov. 21, 2000, entitled "Photonic Integrated Detector Having a Plurality of Asymmetric Waveguides," the contents of which are hereby incorporated by reference in their entirety, there is disclosed a photo-detector device based on the asymmetric waveguide design. Similarly, in U.S. patent application Ser. No. 09/891,639, filed on Jun. 26, 2001, entitled "Asymmetric Waveguide Electroabsorption-Modulated Laser," the contents of which are hereby incorporated by reference in their entirety, there is disclosed a semiconductor optical amplifier (SOA) and laser based on the asymmetric waveguide design.

Thus, several photonic devices that employ ATG design principles have been developed. Applicants have noted that the attributes that make ATG design principles attractive for use in discrete optical devices, likewise make it suitable for use in combining optical devices in complex photonic integrated circuits. Disclosed herein are several exemplary monolithic photonic circuits integrated using asymmetric waveguides. Specifically, exemplary PICs disclosed herein include wavelength converters, integrated array waveguide grating (AWG) and detector arrays, and array waveguide-based channel selectors. The disclosed embodiments illustrate discrete photonic devices operatively interconnected to perform desired functions and integrated on a single substrate. More particularly, the PICs comprise devices for amplifying and generating light, devices for absorbing and detecting light, and devices for transporting, sorting, and modulating light. Notably, at least some of the photonic devices in the PICs comprise at least one waveguide that communicates light with a further waveguide, wherein the mode of light in the waveguide has a different effective index of refraction from the mode of light propagating in the further waveguide. Thus, photonic devices integrated in the PICs incorporate asymmetric waveguide design principles.

Importantly, PICs implemented using asymmetric twin waveguide technology do not have many of the limitations associated with previously existing integration methods. For example, photonic devices and circuits implemented using asymmetric waveguide design principles do not typically require regrowth during the manufacturing process. This allows for standardization of wafer designs and fabrication processes. Furthermore, photonic devices and circuits implemented using asymmetric design principles may be defined on a wafer or chip simply by etching to the various levels between the passive, active, and detector waveguide layers. As a result, arbitrary photonic circuits can be defined on the same wafer simply by locally varying the mask levels as required. This unique capability is similar to that routinely employed in CMOS circuit fabrication—the wafers employed are of a standard design, as are all of the devices which comprise the circuit, and the circuit architecture is varied at the mask level. Employing the "CMOS model," asymmetric waveguide design affords the system engineer the ability to rapidly prototype and develop new and ever more complex circuit functions. For this reason, ATG is ideally suited to the demands of complex applications such as chip-scale wavelength division multiplexing (CS-WDM) applications.

BRIEF DESCRIPTION OF THE DRAWINGS

Other features of the disclosed embodiments will be further apparent from the following detailed description taken in conjunction with the accompanying drawings, of which:

FIG. 8 is represents a truth table for the device of FIG. 7;

FIG. 16A is a diagram illustrating the architecture of an AWG-based channel selector PIC incorporating asymmetric waveguides; and FIG. 16B is a diagram of the device layout of the AWG-based channel selector PIC of FIG. 16A.

DETAILED DESCRIPTION

Photonic integrated circuits employing asymmetric twin waveguide design principles are described below with reference to FIGS. 1–16. It will be appreciated by those of ordinary skill in the art that the description given herein with respect to those figures is for illustrative purposes only and is not intended in any way to limit the scope of the invention. The scope of the invention may be resolved by referring to the appended claims.

Asymmetric Twin Waveguide Design Principles

In U.S. patent application Ser. No. 09/982,001, filed on Oct. 18, 2001, entitled "Twin Waveguide Based Design for Photonic Integrated Circuits," the contents of which are hereby incorporated by reference in their entirety, there is disclosed a modified twin guide (TG) structure, referred to as an asymmetric twin waveguide (ATG), which addresses many of the performance problems commonly associated with conventional TG structures. The ATG design significantly reduces modal interference by substantially confining different modes of light to propagation in different waveguides. This is accomplished by designing the waveguides such that the mode of light that propagates in a waveguide has a different effective index of refraction than the mode of light that propagates in the adjacent waveguide. This feature isolates the light propagating in each waveguide, which lends itself to the specialization of functions performed by the waveguides. The asymmetric waveguides may be laterally tapered to reduce coupling losses by resonant or adiabatic coupling of the optical energy between the waveguides.

Figure 1:
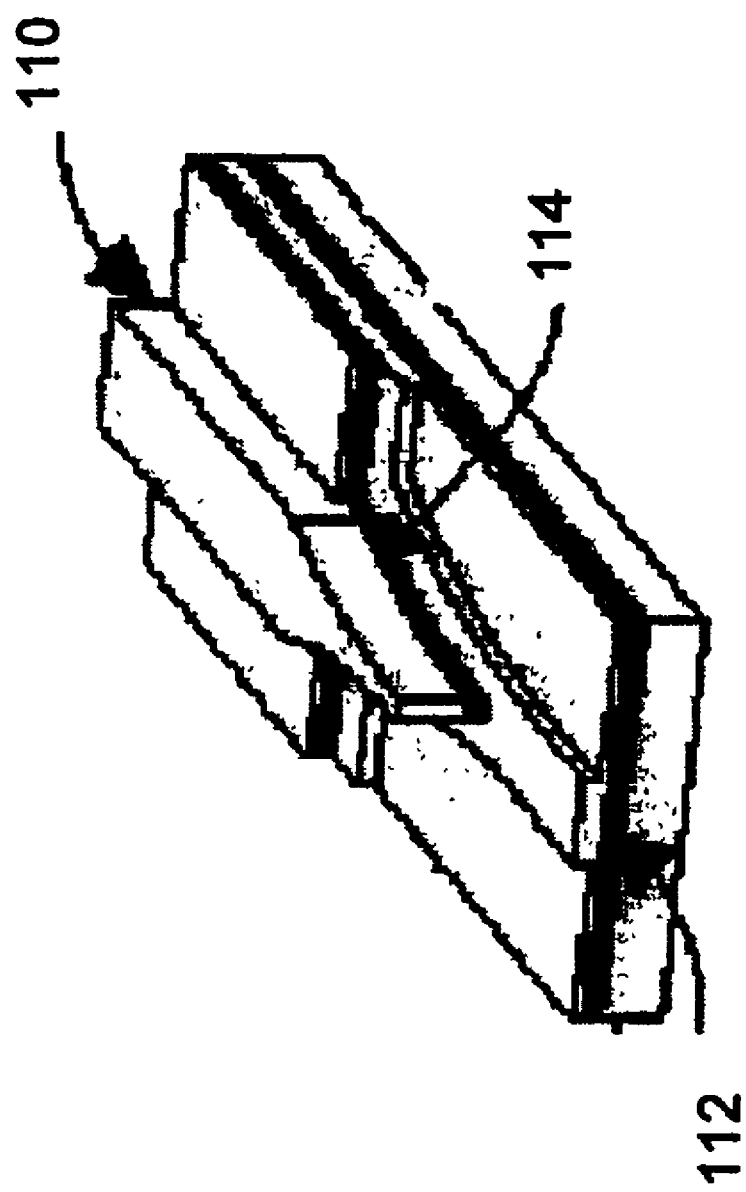
FIG. 1 is a perspective view of an exemplary asymmetric waveguide structure.

FIG. 1 provides a perspective view of a twin waveguide structure for illustrating the principles of the asymmetric waveguide design. As shown, the structure comprises a first waveguide 110 and a second waveguide 112. The material structure of waveguides 110 and 112 has been especially selected such that each waveguide has primarily one mode of light propagating therein. Furthermore, the effective indices of refraction of the modes of light are different. For example, the effective index of refraction of a mode of light propagating primarily in waveguide 110 may be higher than the effective index of refraction of a mode of light propagating in waveguide 112. The isolation of modes propagating in waveguides 110 and 112 allows for the design of specialized functions into the waveguides. For example, waveguide 110 may have an area specially formed therein for amplifying light, i.e. a semiconductor optical amplifier (SOA), while waveguide 112 may be a passive waveguide. Similarly, waveguide 110 may have an area formed therein or thereon for detecting light, e.g. a PIN detector, while waveguide 112 may be a passive waveguide. Isolation allows the mode in each waveguide to propagate without substantial interaction with the mode propagating in the related waveguide. Of course, it may be desirable to move light between waveguides. Accordingly, tapered sections 114, which may be, for example, exponential in shape, are formed in the waveguides to facilitate the movement of light between waveguides. Movement of light between waveguides may be peformed for example by adiabatic or resonant coupling.

Thus, waveguides that are integrally formed together may be especially designed to have modes with different effective indices of refraction propagating therein. This allows for specialized features to be formed in waveguides that operate substantially only on the mode of light propagating therein. Further, taper sections may be formed in the waveguides to facilitate adiabatic or resonant coupling of light between waveguides. These asymmetric waveguide design features are ideal for the formation of photonic devices and, as explained below, for the creation of PICs.

Semiconductor Optical Amplifier and Laser

Indeed, several optical devices have been designed based upon asymmetric waveguide principles. Notably, in U.S. patent application Ser. No. 09/891,639, filed on Jun. 26, 2001, entitled "Asymmetric Waveguide Electroabsorption-Modulated Laser," the contents of which are hereby incorporated by reference in their entirety, there is disclosed a semiconductor optical amplifier (SOA) and laser based on the asymmetric waveguide design. The asymmetric waveguide electroabsorption-modulated lasers disclosed therein provide efficient optical coupling between a laser and a modulator as well as effective isolation between the laser and modulator devices.

Figure 2:
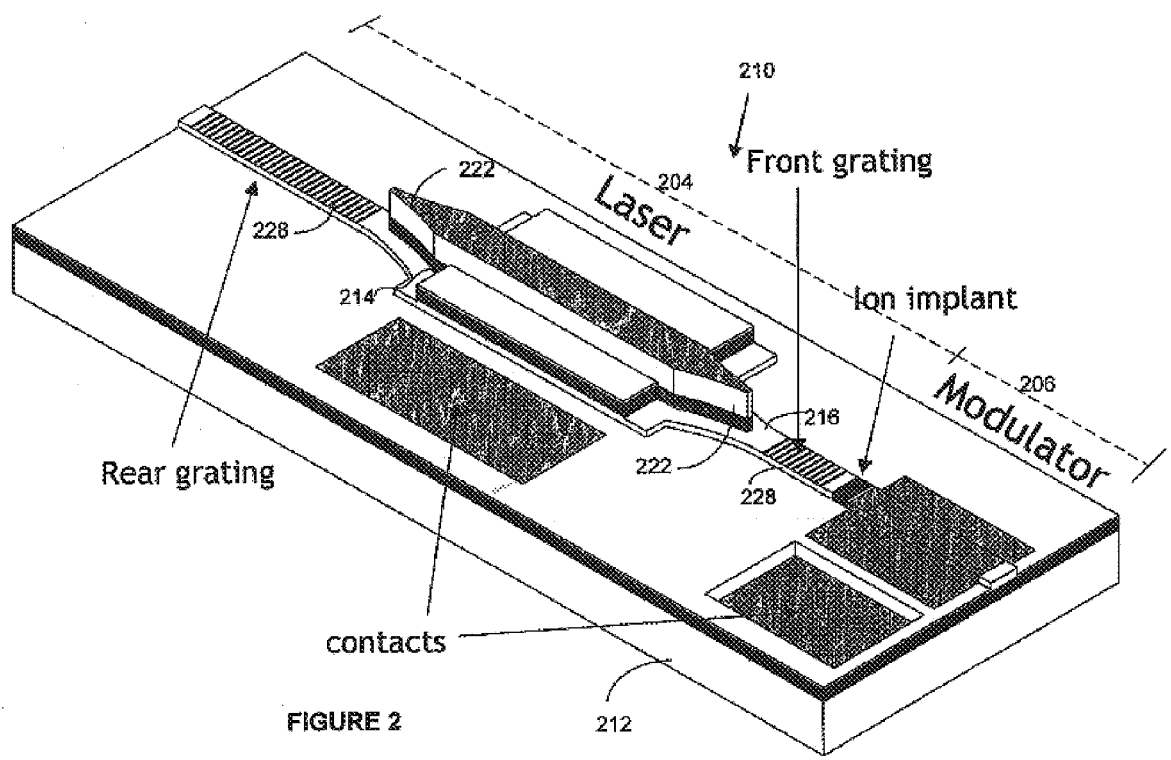
FIG. 2 is a perspective view of a photonic modulated laser device incorporating asymmetric waveguides.

FIG. 2 provides a perspective view of an illustrative laser device incorporating asymmetric waveguide design principles. Light is amplified across the length of a first waveguide and coupled into a second waveguide via a lateral taper. A modulator operates to modulate the light propagating in the second waveguide. Thus, light that is generated and amplified in the first asymmetric waveguide is modulated by a modulator in the second asymmetric waveguide.

As shown in FIG. 2, electroabsorption modulated laser device 210 comprises a laser region 204 and a modulator region 206. A signal generated by laser region 204 is modulated by modulator 206. Generally, device 210 comprises first waveguide 214 and second waveguide 216 which are situated on substrate 212. Waveguide 214 has a gain region, or semiconductor optical amplifier, formed therein for amplifying light propagating in the waveguide. The light propagating in waveguide 214 is transferred into waveguide 216 via lateral tapers 222 formed in waveguide 214. Waveguide 216 has grating sections 228 formed therein. Grating sections 228 operate with the gain section in waveguide 214 to form a distributed Bragg reflector (DBR) laser. Thus, laser region 204 comprises waveguide 214 and the portion of waveguide 216 between gratings 228. The light emitted by the DBR laser region 204 enters modulator region 206, which operates to modulate the signal out of the laser.

Figure 3:
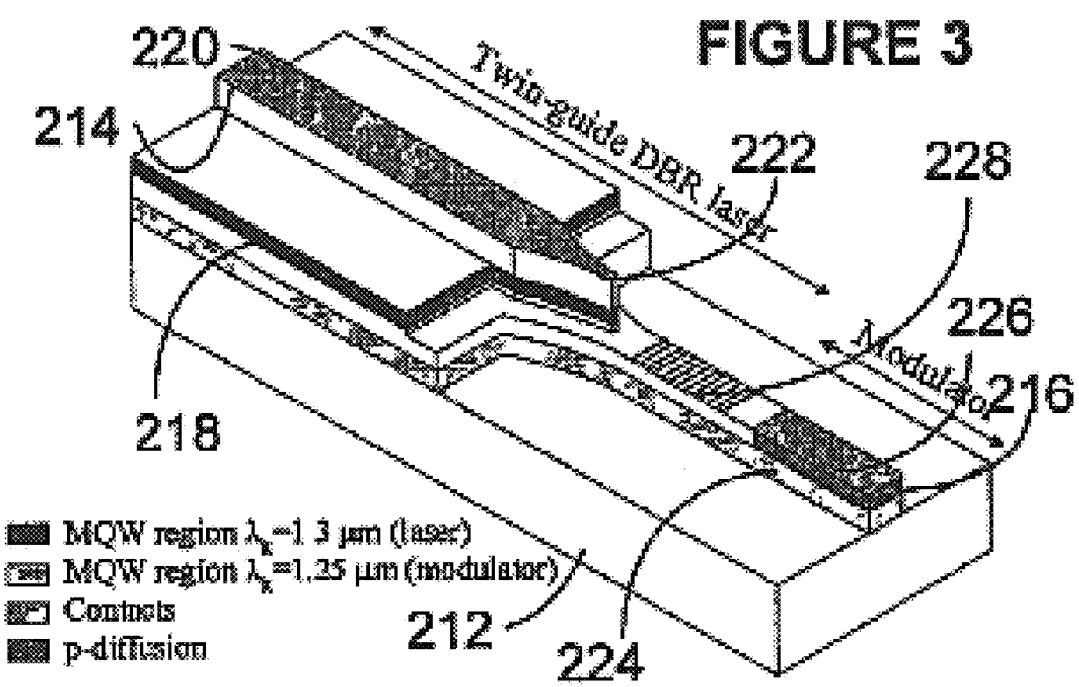
FIG. 3 is an alternate view of the laser device shown in FIG. 2.

FIG. 3 provides a perspective view of a portion of the asymmetric twin waveguide electroabsorption modulated laser depicted in FIG. 2. As shown in FIG. 3, the monolithically integrated twin waveguide modulated laser device 210 is situated on substrate 212 and comprises a first waveguide 214 and a second waveguide 216. Waveguide 214 has multi-quantum well area 218 formed therein for amplifying light propagating in waveguide 214. Laser electrical contact area 220 is used to apply a voltage across multi-quantum well area 218 and thereby generate a lasing signal. The materials and relative thickness of those materials comprising waveguide 214 have been selected such that a single mode of light propagates primarily in waveguide 214. Waveguide 214 has lateral tapers 222 formed therein for transferring light into waveguide 216.

Waveguide 216 is located below waveguide 214 and is integrally formed therewith. Waveguide 216 is designed to guide primarily one mode of light wherein the mode of light has a lower effective index of refraction than the mode of light propagating in waveguide 214. Waveguide 216 comprises multi-quantum well region 224. Electrical contact 226 is used to induce a reverse bias across quantum well region 224 so as to induce bandgap shift and absorption. The reverse bias results in the modulation of the signal being output from waveguide 226.

Generally, multi-quantum well region 224 is transparent to the laser emission wavelength due to bandgap detuning. Therefore, a distributed Bragg grating reflector 228 is etched into waveguide 216. The result is a frequency-stabilized distributed Bragg reflector (DBR) laser 204 whose one frequency optical output is directed along waveguide 216.

Figure 4:
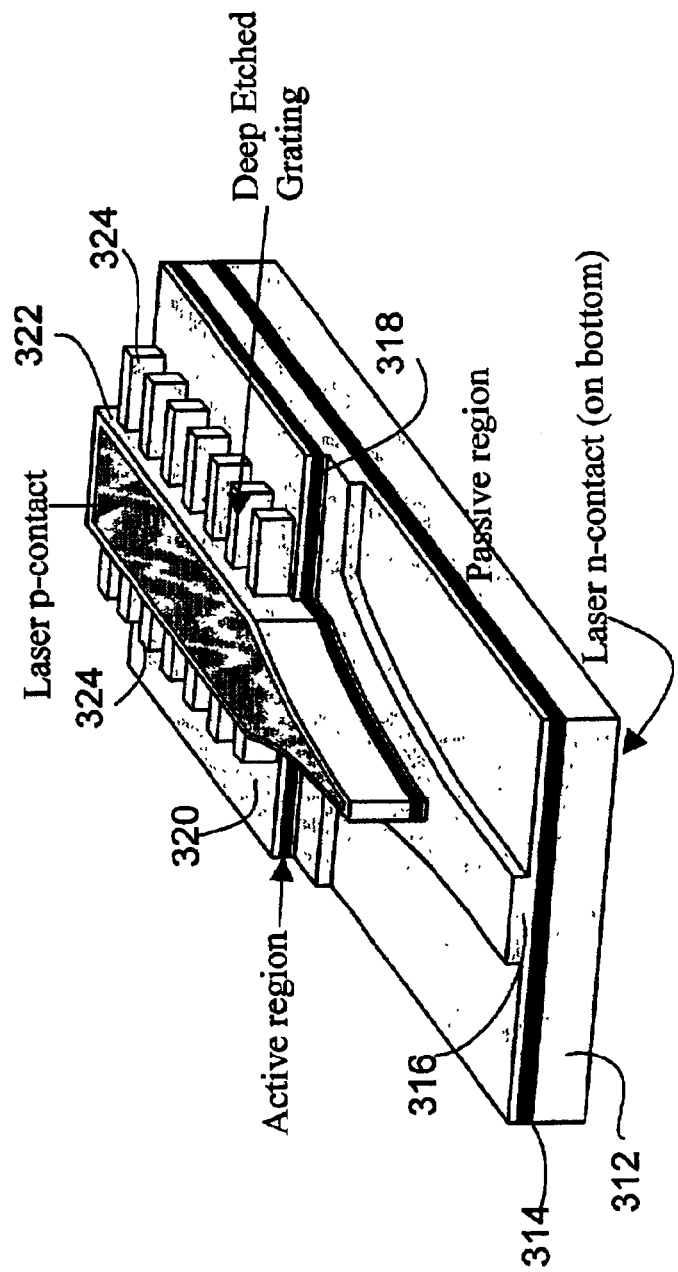
FIG. 4 is a perspective view of a distributed feedback laser.

Another laser device employing ATG design principles is disclosed in FIG. 4. Specifically, there is illustrated a distributed feedback (DFB) laser 310. As shown, laser 310 is formed on n+ InP substrate 312. N+ doped InP layer 314 is formed on top of substrate 312 and provides an n-contact. Passive waveguide 316, which may be for example InGaAsP, is formed on top of substrate 312 and active waveguide 318, which comprises an active region of multi-quantum wells, is formed on top of passive waveguide 316. Importantly, passive waveguide 316 and active waveguide 318 each have primarily one mode of light propagating therein, with the modes having different effective indices of refraction. Barrier layer 320 is formed on top of active waveguide 318 with ridge 322 formed therein along the length of waveguide 318. Grating regions 324 are formed on opposite sides of the ridge and above active waveguide region 318. Gratings 324 reflect primarily one frequency of light and in combination with active waveguide 318 form a DFB laser. A p+contact is formed on top of ridge 322. Finally, a taper area 324 formed in waveguide 318 communicates light between active waveguide 318 and passive waveguide 316. Light is amplified in waveguide 318 and is transferred into waveguide 316 where it can propagate to other devices. Those skilled in the art recognize that the DFB laser of FIG. 4 can be manufactured without regrowth processes.

Figure 5:
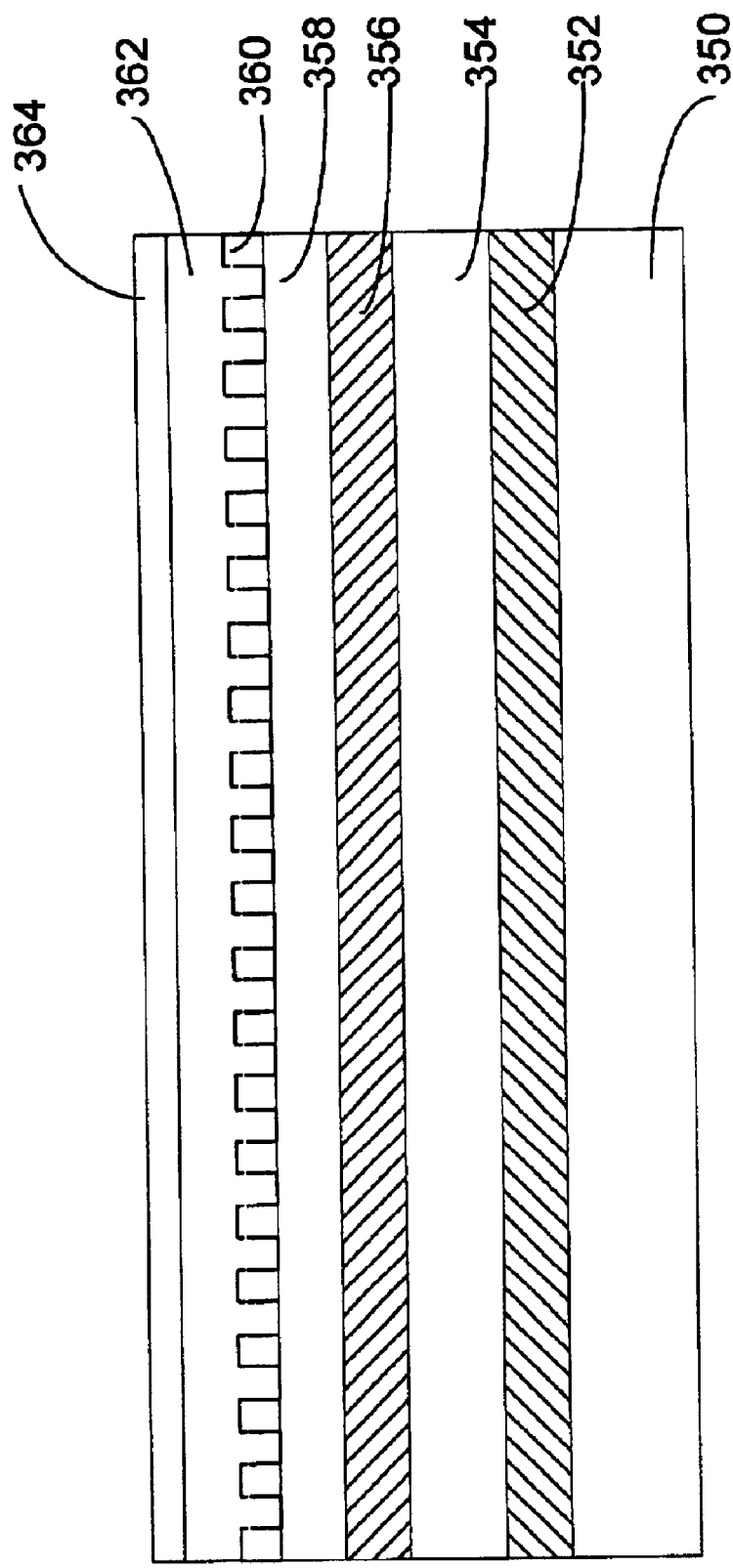
FIG. 5 is a sectional view of a distributed feedback laser formed via a regrowth process.

Of course, a DFB laser employing an asymmetric waveguide design may be formed using a regrowth process. A sectional view of an exemplary DFB laser formed using regrowth is illustrated in FIG. 5. As shown, DFB laser 340 is formed on substrate 350 with buffer layer 352, which may be an n+ layer, formed on top of substrate 350. Passive waveguide layer 354 is formed on top of buffer layer 352. Active waveguide 356, which may comprise multi-quantum wells, is formed on top of passive waveguide 354. Cladding layer 358 is formed on top of active waveguide 356. Etched grating 360 is formed in cladding layer 358. Regrowth cap layer 362 and metal contact layer 364 are formed on top of etched grating 362. Layers 352 through 358 are formed through a series of growth steps. The growth process is interrupted and etched grating 360 formed. Thereafter, the growth process is continued to form layer 362. By using a regrowth process it is possible to form the grating region inside the laser cavity. In accordance with the asymmetric waveguide design, passive waveguide 354 and active waveguide 356 are each formed to have primarily one mode of light propagating therein with the mode propagating in each having a different effective index of refraction than that propagating in the other.

Thus, three exemplary photonic device laser devices employing asymmetric waveguides are disclosed herein. Specifically, the lasers comprise a series of waveguides, wherein the waveguides have been specifically designed to guide substantially one mode of light. Furthermore, the modes of light propagating therein have different effective indices of refraction. This allows for a gain region formed in one of the waveguides to amplify primarily the mode of light propagating therein without substantially affecting the light propagating in the adjacent waveguide. Tapers formed in the waveguides facilitate movement of light between waveguides.

Photonic Detector

A second photonic device implemented using asymmetric waveguide design principles is a photonic detector disclosed in U.S. patent application Ser. No. 09/717,851, filed on Nov. 21, 2000, entitled "Photonic Integrated Detector Having a Plurality of Asymmetric Waveguides," the contents of which are hereby incorporated by reference in their entirety. Generally, in the photo-detector device disclosed therein, light received at a first waveguide is coupled into to a second waveguide via a lateral taper in the second waveguide. A photo-detector device on top of the second waveguide receives the light propagating in the second waveguide through evanescent coupling. Thus, light received at a first waveguide is detected by a detector evanescently coupled to a second waveguide.

Figure 6:
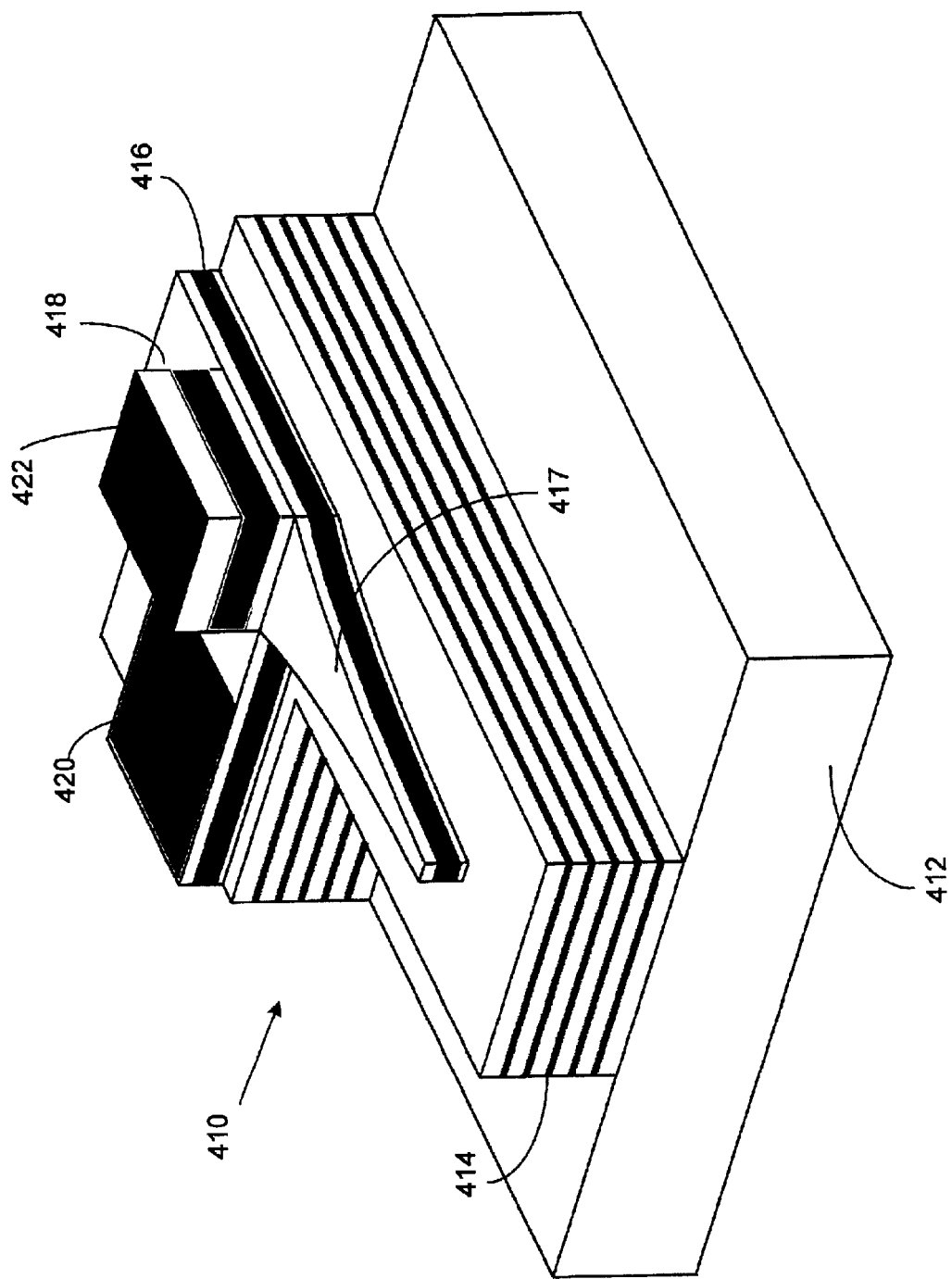
FIG. 6 is a perspective view of an optical detector device incorporating asymmetric waveguides.

FIG. 6 provides a perspective view of the photo-detector device incorporating asymmetric waveguides. As shown, the monolithically integrated photo-detector 410 is situated on substrate 412 and comprises a first waveguide 414, a second waveguide 416, and a detector 418. Photo-detector 410 further comprises n contact 420 and p contact 422. Waveguide 414 is designed to provide a low-coupling loss from a lensed or cleaved single mode optical fiber. The materials and relative thickness of those materials comprising waveguide 414 have been selected such that primarily one mode of light propagates in waveguide 414.

Waveguide 416 is situated on top of and is integrally formed with waveguide 414. Waveguide 416 has been designed to guide primarily one mode of light wherein the mode of light has a higher effective index of refraction than the mode of light propagating in waveguide 414. Waveguide 416 has a lateral tapered area 417 to improve the coupling of light from waveguide 414 to waveguide 416.

Detector 418 is situated on top of and integrally formed with waveguide 416. In alternative embodiments, detector 418 might be formed in waveguide 416. Light enters the photo-detector device 410 through waveguide 414, which may be coupled to another device such as, for example an optical fiber. At least a first mode of light propagates through waveguide 414 and upon reaching tapered portion 417 of waveguide 416, begins to propagate in waveguide 416. The effective index of refraction of the first mode increases across the length of taper region 417. As a consequence, upon reaching the wide end of taper region 417, the light propagating in the taper is transitioned into a second mode of light, which is primarily confined to waveguide 416. The second mode of light propagating primarily in waveguide 416 is coupled to detector 418. Over the length of detector 418, sufficient quantities of the evanescent fields can be absorbed to effectively identify the presence of light in waveguide 416.

Thus, a second photonic device has been implemented in accordance with asymmetric waveguide design principles. Specifically, a first waveguide, which has substantially one mode of light propagating therein, transports light to a second waveguide, which has substantially a second mode of light propagating therein, wherein the light is detected. In accordance with ATG design principles, the effective indices of the modes of light propagating primarily in each of the waveguides is different, which allows for the specialization of functional features in each of the waveguides. Taper areas facilitate the movement of light between waveguides.

Photonic Integrated Circuits Using ATG

Applicants have noted the same attributes that make ATG attractive for use in discrete optical devices likewise make it suitable for use in combining optical devices in complex photonic integrated circuits. Specifically, the ability to move light between waveguides while isolating the modes of light in the waveguides lends itself to the combination of photonic devices in a single chip. Accordingly, disclosed herein are several exemplary monolithic photonic circuits integrated using asymmetric waveguide design principles. Exemplary devices disclosed herein include wavelength converters, integrated array waveguide grating (AWG) and detector arrays, and array waveguide-based channel selectors. The disclosed embodiments illustrate asymmetric waveguide design principles are effective for combining photonic devices with very different characteristics into complex photonic circuits. In particular, photonic devices that amplify or create light are integrated with photonic devices that absorb and detect light and devices that transport, sort and modulate light.

Wavelength Converters

Wavelength converters are key elements in any WDM system, yet to date there are no commercially available integrated solutions that provide this functionality.

Generally, wavelength converters consist of SOAs that operate on the principle of gain depletion. That is, an intense beam of data at $\lambda_1$ is coincident with a second, continuous wave (CW) beam at $\lambda_2$ within the SOA active region. The intense beam reduces the gain of the SOA, which attenuates the CW beam impressing the data on that second channel. Thereafter, the original pulse at $\lambda_1$ is removed from the output port by optical filtering. This scheme has several drawbacks: it requires an intense input beam to effect even a small (<3 dB) gain loss in the output channel, and the gain recovery time of the SOA is too long (~100–500 ps) for many high bandwidth applications. To remedy this situation and enhance signal amplitude, SOAs have been placed in bridges, allowing for optical phase cancellation at the bridge output port. Since bridge response is time dependent (determined by the difference in time a beam takes to traverse one arm verses the other arm of the bridge), this architecture is only suitable for use in digital systems where there is a well-determined and constant bit rate.

Digital Wavelength Converters

Figure 7:
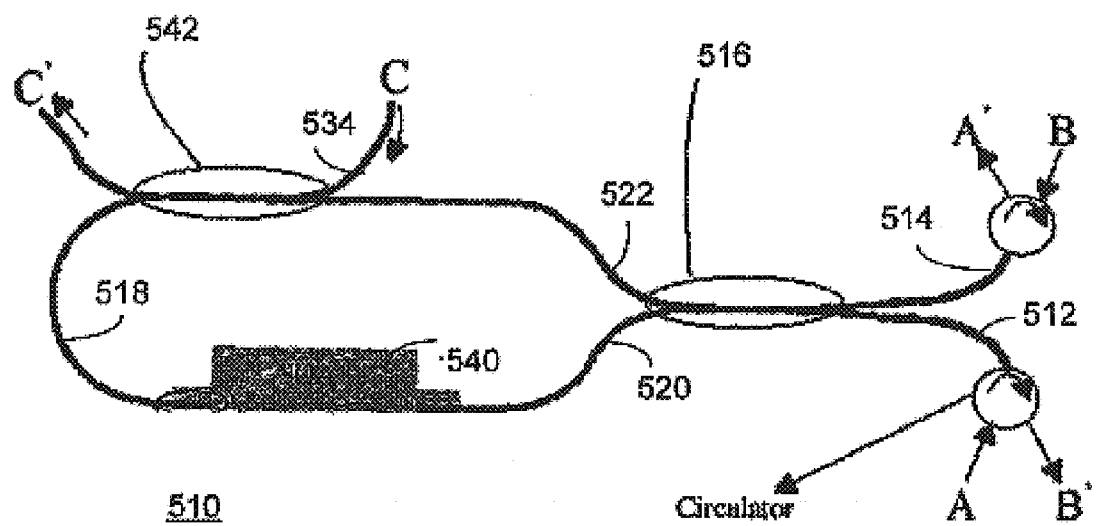
FIG. 7 is a perspective view of an optical logic gate that may also operate as a digital wavelength converter.

An exemplary bridge wavelength converter integrated using asymmetric waveguide principles is illustrated in FIG. 7. Generally, the PIC of FIG. 7 is an all-optical Fredkin gate, the concept of which is discussed in an article entitled "Conservative Logic" by Edward Fredkin and Tommaso Toffoli, 21 Int. J. Theor. Phys. 219 (1982). Generally, a Fredkin gate is a reversible logic element comprising three inputs and three outputs. One of the inputs serves as a control input that can be used to alter the output generated by the other two inputs. The Fredkin gate acts as a universal gate and can be made to realize all of the standard Boolean logic functions such as, for example, a logical AND, NAND, OR, and NOR. As explained below, the logic gate may be employed to operate as a wavelength converter.

Illustrative logic gate or wavelength converter 510 comprises a first input/output waveguide 512 and a second input/output waveguide 514. First and second waveguides 512 and 514 receive inputs A and B into converter 510 and transmit corresponding outputs B' and A' respectively out of converter 510. As shown, input/output waveguides 512 and 514 intersect optical coupler 516, which, in the illustrative embodiment, is a four-port bi-directional multimode interference (MMI) coupler with a 50:50 split between ports 520 and 522, and 514 and 512.

Coupler 516 is also connected to loop waveguide 518 at loop terminations 520 and 522. Light pulses received at coupler 516 from input/output waveguides 512 and 514 are transmitted into terminations 520 and 522 of loop waveguide 518. More specifically, light pulses received at coupler 516 from either input/output waveguides 512 and 514 are split evenly and transmitted into terminations 520 and 522. For example, input A received over input/output waveguide 512 is split by coupler 516 into two, with one half being transmitted into termination end 520, and the other half into termination end 522. Light pulses entering loop waveguide 518 at termination end 520 travel along loop 518 in a clockwise direction. Light pulses entering loop waveguide 518 at termination end 522 travel along loop 518 in a counterclockwise direction. Thus, inputs into logic gate 510 result in two counter-propagating light pulses in loop waveguide 518.

Waveguide loop 518 has formed therewith semiconductor optical amplifier (SOA) 540. Generally, SOA 540 operates to amplify signals propagating in waveguide loop 518. SOA 540 comprises an asymmetric waveguide with lateral tapers for moving light between loop waveguide 518 and an upper amplifying region of SOA 540. Thus, the gate/wavelength converter 510 incorporates the asymmetric waveguide principles discussed above in connection with FIG. 1. Loop waveguide 518 further intersects with a second optical coupler 542, referred to herein as control pulse coupler. Control pulse coupler 542 operates to couple a control pulse, C, into loop waveguide 518 from waveguide 534. When control pulse C enters SOA 540, the gain region of SOA 540 becomes saturated and, therefore, cannot amplify other signals passing through the SOA at the same time. Accordingly, light pulses traveling in loop waveguide 518, i.e. light pulses entering from input/output waveguides 512 and 514, which propagate through the portion of waveguide 518 corresponding to SOA 540 while SOA 540 is saturated due to a control pulse, do not experience gain. However, light pulses passing through the SOA 540 while SOA 540 is not saturated, experience gain and are phase shifted relative to pulses that are not amplified.

As shown, SOA 540 is offset from the center of loop waveguide 518. Therefore, it is possible to saturate SOA 540 with control pulse C so that only one of two light pulses traveling in opposite directions in waveguide 518 experience gain. When two counter-propagating pulses are received back at optical coupler 516, and one of the two are phase shifted relative to each other, coupler 516 transmits the light pulses to the input/output waveguide 512 and 514 opposite that on which the corresponding input signal was originally received.

Generally, in the illustrative embodiment, the logic gate operates in reflection mode, i.e. for every light pulse that enters the logic gate, a light pulse is transmitted from the logic gate on the same input/output waveguide. Logic gate 510 is made to operate in non-reflective mode by introducing control pulse C, which as described above, causes counter-propagating signals to be phase shifted relative to each other.

A truth table for logic gate 510 is shown in FIG. 8. As shown, when control pulse C is inactive, i.e. equal to 0, output signals are transmitted on the same input/output waveguide as the input signals. For example, an input signal A, which propagates on input/output waveguide 512, results in an output signal B', which also propagates on input output waveguide 512. When control pulse C is introduced, however, light propagates out of logic gate 510 on the input/output waveguide opposite from which it entered. For example, when an input signal C is entered into the gate 510, input signal A, which enters through input/output waveguide 512, results in output signal A', which propagates on input/output waveguide 514. Thus, introducing control signal C allows for changing the nature of the logic gate. Indeed, as shown in the truth table of FIG. 8, logic gate 510 can be made to operate to perform any number of Boolean operations.

According to an aspect of the invention, SOA 540 comprises an asymmetric twin-waveguide structure with tapers. The asymmetry between waveguides reduces the interaction between optical modes and thereby reduces much of the destructive interference that might otherwise result. The tapers, which may be, for example, lateral tapers facilitate the movement of light between waveguide 518 and SOA 540. An SOA with an asymmetric waveguide structure and lateral tapers can be implementated in a relatively small form factor using robust manufacturing techniques.

Figure 9:
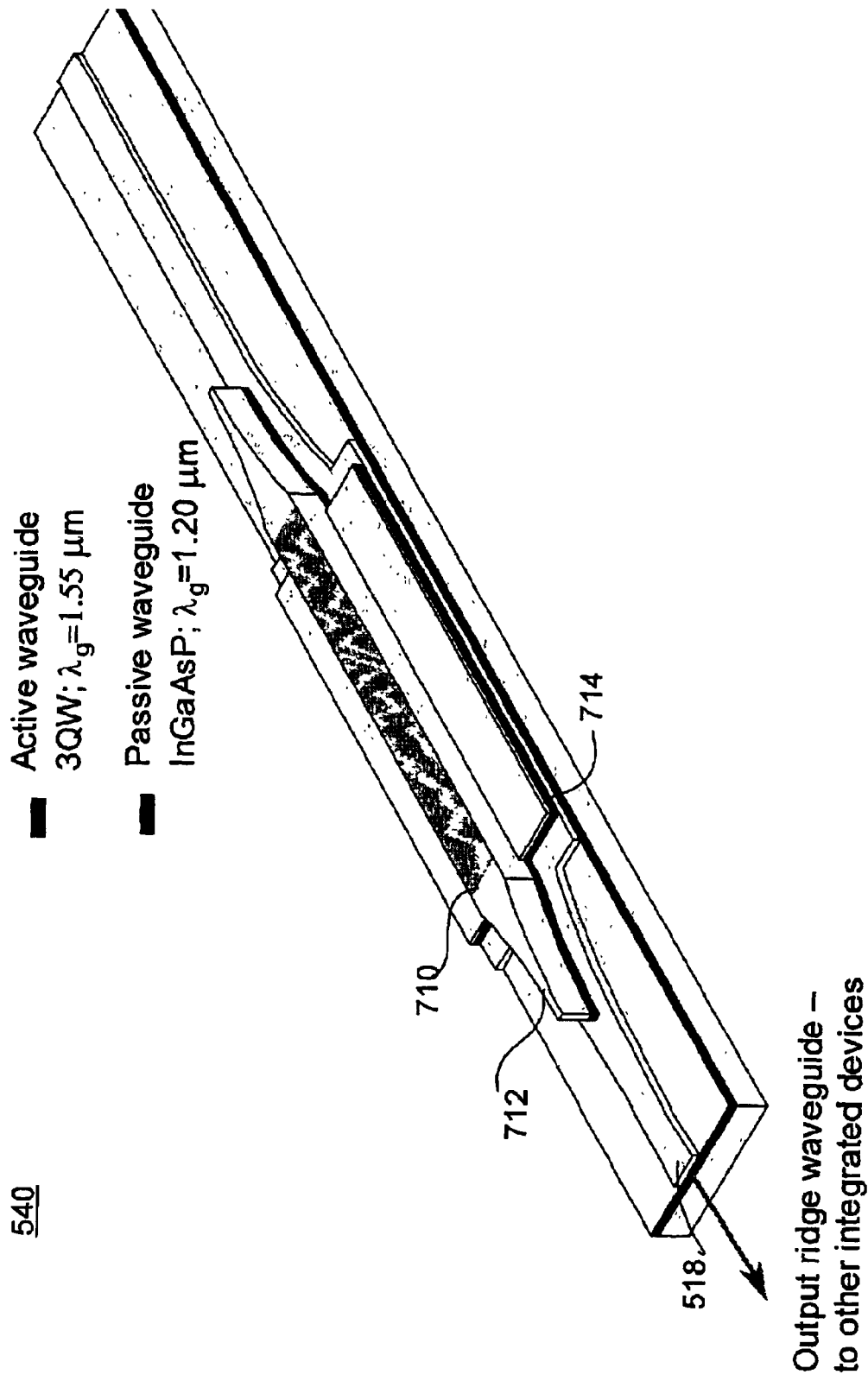
FIG. 9 is a diagram illustrating a semiconductor laser incorporating asymmetric waveguides.

FIG. 9 provides a perspective detailed view of SOA 540. As shown, SOA 540 is situated on top of waveguide 518 and integrally formed therewith. According to the illustrative embodiment, SOA 540 comprises waveguide 710. Waveguide 710 has lateral tapers 712 formed therein for moving light between waveguide 518 and waveguide 710. Waveguide 710 has a gain region 714 formed therein for amplifying light propagating in waveguide 710. In the illustrative embodiment, gain region 714 comprises one or more multi-quantum wells. Light propagating in waveguide 518 moves into waveguide 710 via lateral tapers 712, wherein it is amplified by gain region 714 before being moved back into waveguide 518. Waveguide 710 is designed to guide primarily one mode of light, wherein the mode of light has a higher index of refraction than the mode of light propagating in waveguide 518. This asymmetric design, i.e. the differences in indexes of refraction between waveguides 518 and 710, reduces modal interference in SOA 540.

Figure 10:
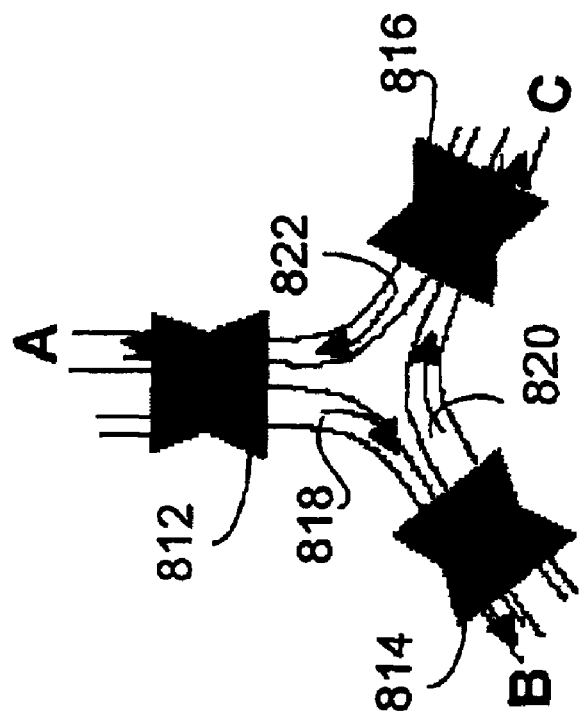
FIG. 10 is a diagram illustrating an optical circulator.

Referring back to FIG. 7, gate 530 further comprises optical circulators 570. Generally, optical circulators are non-reciprocal devices that direct light from port to port in a single direction. An optical circulator suitable for use in logic gate 510 is depicted in FIG. 10. As shown, optical circulator 810 comprises three MMI couplers 812, 814, and 816 connected with waveguides 818, 820, and 822. MMI couplers 812, 814, and 816 and waveguides 818, 820, and 822 have been specially selected/designed so that light entering any one of couplers is routed to the next adjacent coupler. Specifically, in the disclosed embodiment, the shape and length of couplers 812, 814, and 816 have been selected to route light primarily to the output waveguide that is wider. Furthermore, waveguides 818, 820, and 822 have been especially designed to have a wide end and a narrow end. The wide and narrow ends are paired with each other so that each coupler has a wide and a narrow end at the output side. For example, referring to FIG. 10, light received on waveguide A into coupler 812 is routed to the widest waveguide at its output, which is waveguide 818. Waveguide 818 tapers across its length and delivers the light to coupler 814 where it is primarily routed to wavegude B. Similarly, light received on waveguide B into coupler 814 is routed to the widest waveguide at its output. The narrow end of waveguide 818 has been paired with the wide end of waveguide 820 at the output of the coupler 814. Accordingly, out of coupler 814, light is routed primarily to waveguide 820, which routes the light to coupler 816 and received on waveguide C. Finally, light received on waveguide C into coupler 816 is routed primarily to waveguide 822 because it is wider than waveguide 820 at the output of coupler 816. Waveguide transports the light to coupler 812, where it is delivered on waveguide A. Thus, in the disclosed embodiment, the optical circulator is a three-port device that can direct light to the adjacent port in a clockwise direction. In the case of logic gate 510, a circulator may be used to route inputs into waveguides 512 and 514 as well as receive outputs from waveguides 512 and 514.

Logic gate 510 may be employed as a wavelength converter. Referring to FIG. 7, an input stream of data comprising a series of ones and zeroes, and at a wavelength $\lambda_1$, may be entered into gate 510 at control input 534. Meanwhile a continuous wave (CW) signal with a second wavelength $\lambda_2$ may be entered on waveguide 512. When the control input stream entered at 534 corresponds to zero, i.e. the absence of a pulse, the CW signal entering at waveguide 512 returns to the same waveguide 512. However, when the input stream entered at 534 corresponds to a one, a phase shift is introduced, as explained above, and an output, which has wavelength $\lambda_2$, is output on waveguide 514.

Thus, whenever the input stream at waveguide 534, which is at wavelength $\lambda_1$, corresponds to a value of one, an output signal is generated at waveguide 514 with a wavelength of $\lambda_2$. Accordngly, the logic gate of FIG. 7 can be used to operate as a wavelength converter. Those skilled in the art recognize that the placement of SOA 540 in loop 518 is critical to the timing of the gate/wavelength converter. Specifically, the switching time window of the gate, which may be thought of as the bit interval I, can be calculated from the equation $I=2n\Delta L/c$, wherein c is the speed of light in a vacuum, n is the effective index of passive waveguide 518, and $\Delta L$ is the location of SOA 540 from the center of loop 518.

Importantly, the logic gate/digital wavelength converter PIC of FIG. 7, employs asymmetric twin waveguide integration. In particular, SOA 540 is integrated with the transport waveguides via asymmetric waveguide design principles. Thus, a waveguide having a gain region formed therein is integrally formed with transport waveguides. As described above in connection with FIG. 1, the modes of light propagating in the waveguides have different effective indices of refraction and taper sections are used to facilitate movement of light between waveguides. Therefore, the disclosed logic gate/digital wavelength converter is an example of a PIC comprising active waveguide devices for amplifying light integrated with passive transport waveguides for transporting light.

Analog/Digital Wavelength Converters

As noted above, a disadvantage of using gain depletion for wavelength conversion is the small change in gain affected by a relatively intense signal pulse. This problem is circumvented in the logic gate/wavelength converter described above by employing a shift in index of refraction accompanying changes in gain, and then placing the offset SOA into an optical bridge. However, this approach is not useful in analog systems, where pulse timing is not available. Hence, wavelength conversion for optical analog systems remains a largely unsolved problem. The requirements of time independence (across the instantaneous bandwidth of the signal channel), high dynamic range (DR), and low noise figure (NF) present a significant challenge for such a device.

Accordingly, a novel timing independent wavelength converter is disclosed with the potential for very high DR, which represents the intensity ratio between maximum power allowing for linear operation to the minimum noise limited power, and low NF ($NF=10\log_{10}P_{out}/P_{in}$) suitable for the most stringent analog system applications. The analog wavelength converter is signal pattern independent, allowing for its adaptation for digital applications as well. The wavelength converter employs a diversity of components including a tunable laser source, a Mach-Zehnder modulator, a photodetector, and an SOA interconnected by passive waveguides. Accordingly, the analog wavelength converter is particularly well suited to fabrication using ATG technology due to the capability of this integration platform for combining such a wide diversity of components on a single, monolithic chip.

Figure 11:
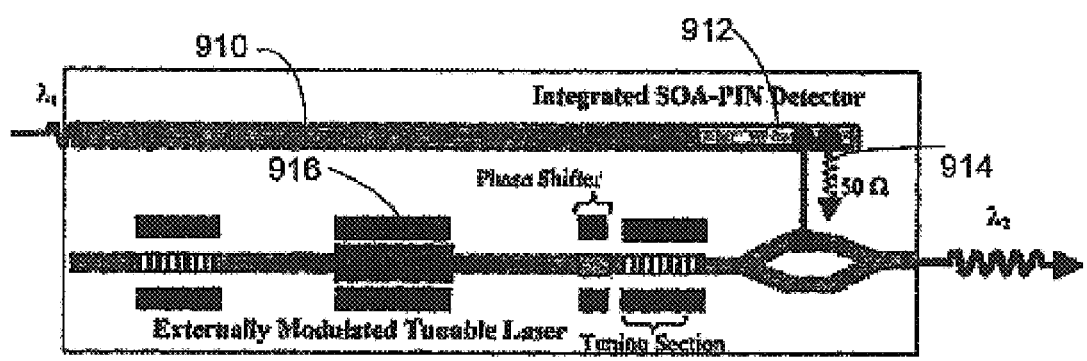
FIG. 11 is a schematic diagram of an analog wavelength converter incorporating asymmetric waveguides.

The illustrative analog/digital wavelength converter is shown schematically in FIG. 11. As shown, the signal at $\lambda_1$ propagates on waveguide 910 and is detected by integrated SOA/pin detector 912. In an exemplary embodiment, for incident optical power of ~100 $\mu$W, the current generated by SOA-pin detector 912 may be ~5–10 mA, assuming an SOA gain of 20 dB and a pin responsivity of 0.8 A/W. Output current is coupled to resistor 914 which may be, for example, a 50 Ω resistor, and the voltage drop is used to directly drive the modulator section of modulated tunable laser (EMTL) 916. In an exemplary embodiment, the disclosed circuit may produce a voltage swing of 0.5–1 V, which is sufficient to produce a linear (~10 dB) modulation depth for a modulator in a M–Z configuration. The tunable laser in conjunction with the modulator gives the freedom to convert the incident wavelength to any desired wavelength (within the allowed tuning range of the laser).

Figure 12:
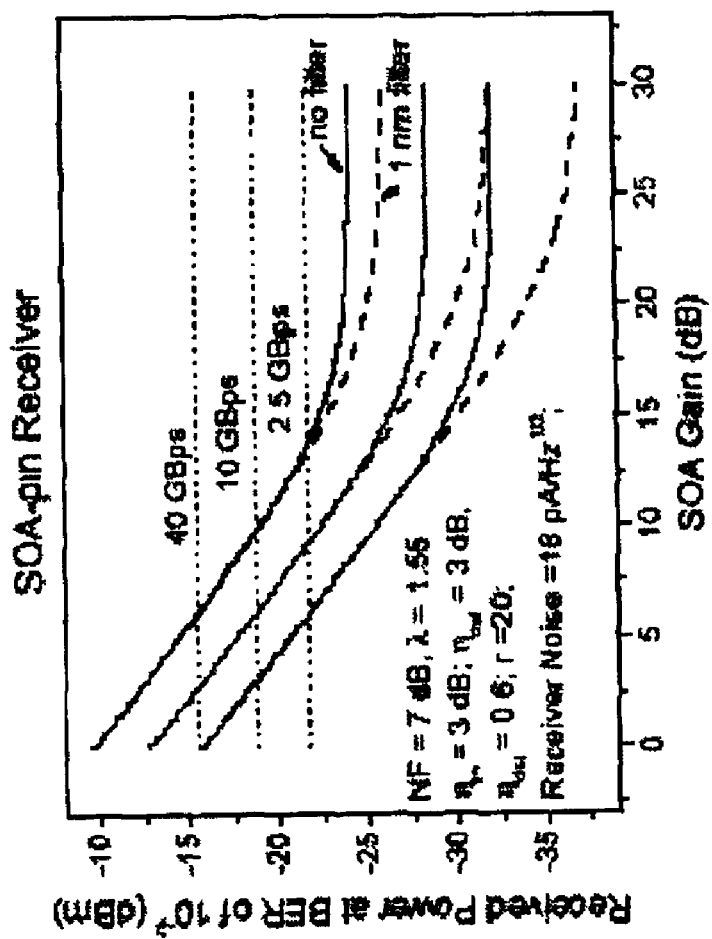
FIG. 12 is a graph illustrating the sensitivity of an SOA-PIN component of the analog wavelength converter of FIG. 11.

The analog sensitivity performance of the wavelength converter may be estimated. FIG. 12 provides a graph illustrating the receiver sensitivity for a digital SOA/pin component at 2.5, 10 and 40 Gb/s with and without filtering of the amplified spontaneous emission of the SOA prior to coupling to the pin. For this calculation, it is appropriate to assume a bit error rate of $10^{-9}$, which leads to a signal to noise ration (SNR) equal to 5.7. An amplifier input impedance of 50 Ω determines the noise characteristics of the following electronic stages. Furthermore, the best and worst-case scenarios may be considered. For an electroabsorption modulator coupled to a $\lambda=1.55$ μm laser using ATG technology, it is possible to achieved an output power change of $\Delta P \sim 5$ mW for a voltage swing of ~2.5V. While this power swing over the linear response region of the modulator sets the upper limit to the dynamic range of the converter, the lower limit is set by the laser relative intensity noise (RIN) (which is approximately 10 times higher than the shot noise floor of the detector). Assuming RIN=−140 dB/Hz characteristic of today's conventional DFB and DBR lasers, we obtain a dynamic range for an analog wavelength converter (where SNR=1) of 135 $(dB/Hz)^{2/3}$ and a noise figure of NF=12. With some modest improvement in detector sensitivity from the current 0.8 A/W to 1 A/W, assuming a more aggressive RIN=−150 dB/Hz which remains well within the capabilities of the ATG DBR design, and finally employing a Mach-Zehnder interferometric modulator as planned in the integration scheme shown in FIG. 11 where the voltage swing is reduced to ~1V for the same $\Delta P$, it is possible to obtain DR=150 $(dB/Hz)^{2/3}$ and NF=6. These values are consistent with the needs of high performance analog systems, making this unique wavelength converter an important enabling component for fully integrated analog and digital systems operating at instantaneous or digital signal bandwidths exceeding 40 GHz.

Figure 13:
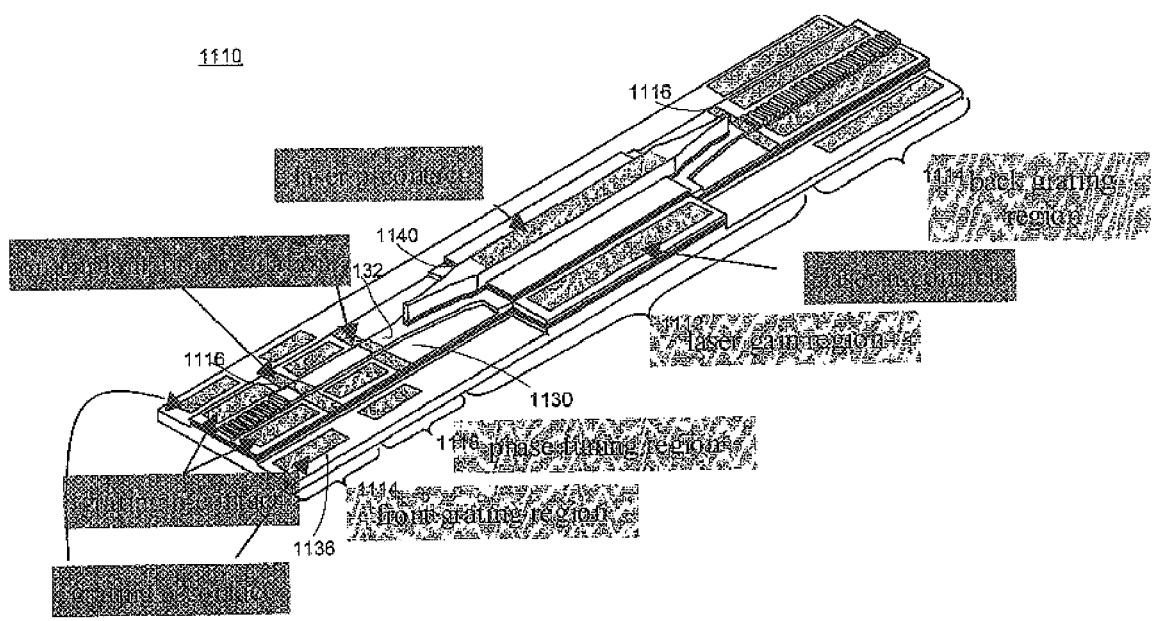
FIG. 13 is a diagram depicting a tunable laser device incorporating asymmetric waveguides and suitable for use in the analog wavelength converter of FIG. 11.

A tunable laser suitable for use in the analog wavelength converter is illustrated in FIG. 13. Generally, the tunable laser incorporates the laser design described above in connection with FIG. 2, as well as those designs described in detail in U.S. patent application Ser. No. 09/891,639, filed on Jun. 26, 2001, entitled "Asymmetric Waveguide Electroabsorption-Modulated Laser," the contents of which are incorporated by reference. As shown in FIG. 13, the tunable laser 1110 comprises a laser gain region 1112, grating regions 1114, and an ion implantation insulation area 1116. The tunable laser further comprises a phase tuning region 1118, with an ion implantation region 1116 providing insulation between phase tuning region 1118 and grating region 1114. Additionally, the tunable laser of FIG. 13 has a shoulder area 1130 formed in passive waveguide 1132. Shoulder area 1130 facilitates the placement of contacts 1134 on laser 1110. Thus, a first contact in a contact pair is placed on shoulder area 1130, and a second contact in a contact pair is placed on bottom floor 1136. Using these contact pairs, current can be injected into grating regions 1114 and phase shift region 1118 so as to change the refractive index of the effected area. In grating regions 1114, the refractive index change has the effect of changing the effective grating period, which alters the reflectivity spectrum of the grating and selects the desired wavelength. In the phase tuning region 1118, changing the effective index of refraction causes the desired wavelength mode to match the phase requirement of having an optical mode fit entirely within the laser cavity formed by opposing gratings. Phase region tuning therefore results in continuous wavelength tuning free of modal hops.

Of course, the tunable modulated laser of FIG. 13 employs asymmetric waveguide design principles. Accordingly, a mode of light propagating in waveguide 1132 has a different effective index of refraction than a mode of light propagating in waveguide 1140. Therefore, the gain region of waveguide 1140 amplifies substantially only the modes of light propagating therein and not the modes of light propagating in waveguide 1132.

An exemplary integrated SOA/pin detector suitable for use in the analog wavelength converter described above is described in U.S. patent application Ser. No. 09/717,851, filed on Nov. 21, 2000, entitled "Photonic Integrated Detector Having a Plurality of Asymmetric Waveguides," the contents of which are hereby incorporated by reference in their entirety. Generally, integrating a semiconductor amplifier (SOA) before a photodiode improves the receiver sensitivity and possibly eliminates the need for electronic amplifiers. In order to realize these benefits, light in an optical amplifier (SOA) is transferred into a waveguide on top of the optical amplifier (SOA), and the light propagating in the waveguide evanescently absorbed by a diode.

Applicants have noted two problems sometimes arise when placing an SOA before a photodiode using this straightforward method. First, a thick optical amplifier cladding layer (>1 μm) makes power transfer difficult using taper coupler. Second, in the power transfer process, the active medium under the taper coupler is unpumped, resulting in optical loss. An SOA-detector combination illustrated in FIG. 14 circumvents these problems. Specifically, in the device of FIG. 14, the semiconductor optical amplifier (SOA) cladding consists of a second waveguide whose effective index is larger than the active guide (SOA).

Figure 14:
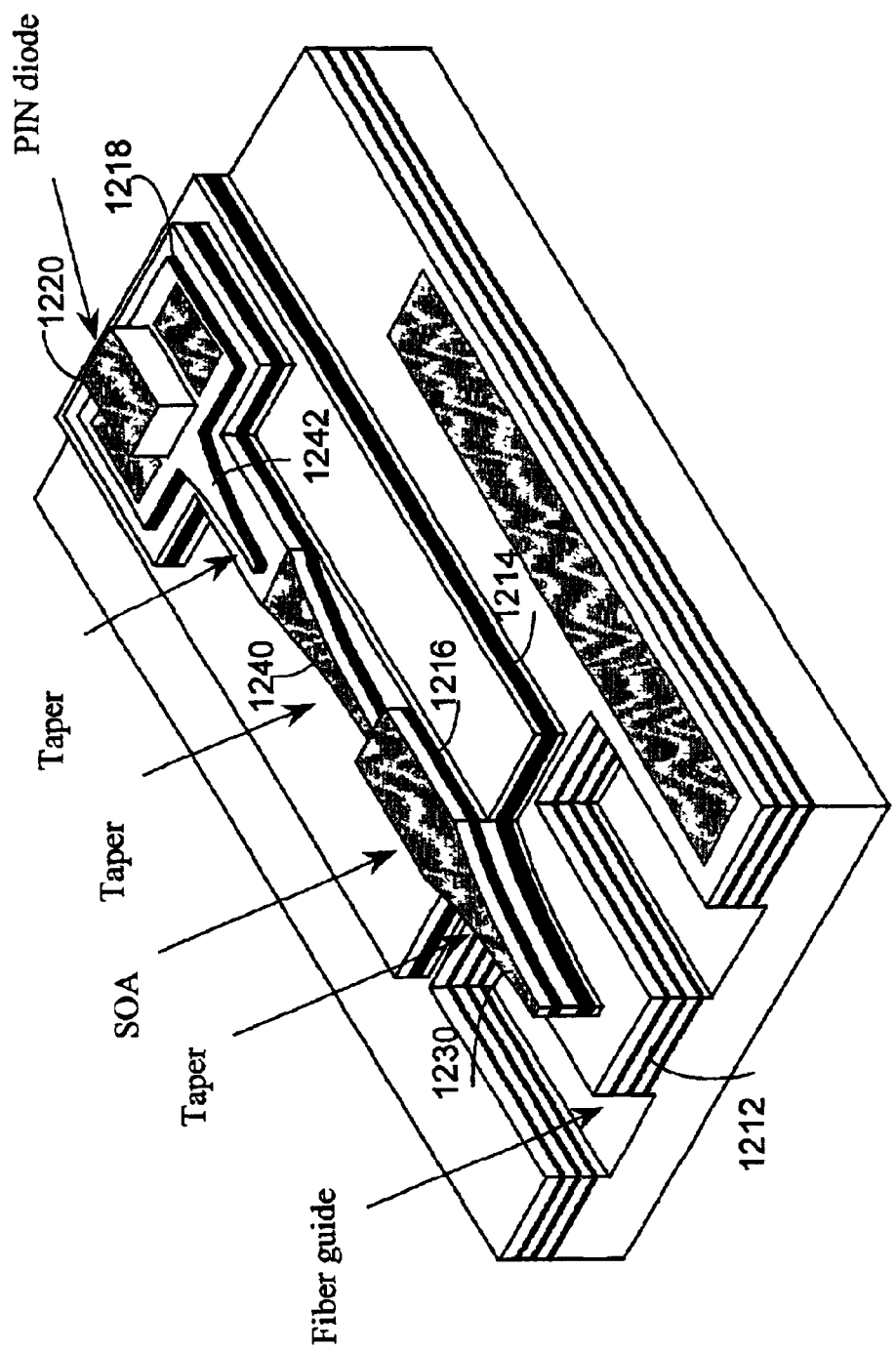
FIG. 14 is a diagram depicting a semiconductor optical amplifier detector device incorporating asymmetric waveguides and suitable for use in the wavelength converter of FIG. 11.

As shown in FIG. 14, the SOA detector comprises a fiber guide 1212, which may be waveguide 910 of FIG. 11. Formed on top of fiber guide 1212 is active guide 1214, which has formed therewith guide 1216. Still another waveguide 1218 is formed with guide 1216, and a photodiode 1220 is formed with waveguide 1218. Light enters waveguide 1212 and is transferred into waveguide 1214 by taper 1230. Importantly, taper 1230 is formed in both waveguide 1214 and 1216, but waveguide 1216 and the cladding layers connecting it to waveguide 1214 are specially designed so that light is transferred by taper 1230 substantially into only waveguide 1214 and not waveguide 1216. The light is amplified while propagating in waveguide 1214, and at taper 1240 is transferred into waveguide 1216. Across the length of taper 1240, active waveguide 1214 is pumped so as to avoid optical loss. Taper 1242 operates to transfer light into waveguide 1218. Across waveguide 1218, the light is evanescently coupled into diode 1220.

In an exemplary embodiment, waveguide 1212 may comprise three layers of 0.15 μm thick InGaAsP ($E_g$=1.03 eV) interspersed in 0.5 micrometer thick InP layers, which form a near circular mode that allows for low-loss, enhanced alignment tolerance fiber coupling. Waveguide 1212 is doped with Si at $1\times10^{18}$ cm$^{-3}$, allowing the injection of electrons to the active region from the side.

In an exemplary embodiment, active waveguide 1214 comprises several (usually 2 to 5) 135 Å, 1% compressively strained InGaAsP ($E_g$=0.8 eV) quantum wells separated by 230 Å InGaAsP ($E_g$=1.03 eV) barriers and sandwiched in two 120 nm thick InGaAsP ($E_g$=1.03 eV) separate confinement heterostructure layers. Waveguide 1216 comprises a 600 Å thick InGaAsP ($E_g$=0.89 eV) layer sandwiched in two 320 nm thick InGaAsP ($E_g$=1.03 eV) layers. A 0.6 µm thick InP layer separates the two waveguides, and a 0.5 µm thick InP cladding layer and 0.1 µm thick InGaAsP ($E_g$=1.03 eV) contact layer cap the waveguide 1216. Waveguide 1216, the InP separation layer, and the InP cladding layer are doped with Be at $2.5\times10^{17}$ cm$^{-3}$, and 0.1 µm thick InGaAsP ($E_g$=1.03 eV) contact layer is heavily doped with Be at $3\times10^{18}$ cm$^{-3}$. This relatively low doping concentration reduces the free carrier absorption in the p region, while the series resistance is still small (<0.4 Ω). The shape of taper coupler 1230 is designed to ensure the maximum power transfer from fiber guide 1212 to active waveguide 1214. The taper length is 200 µm and the width varies from 1 µm to 3 µm. Importantly, the effective index of the passive guide 1216 is always larger than that of the active waveguide 1214 when the taper width varies. In other words, passive waveguide 1216 and active guide 1214 are always off resonance, so most of the light (about 95%) in fiber guide 1212 is transferred to active guide 1214 and amplified.

After amplification, the width of the passive guide 1216 shrinks to 1 µm abruptly. Since most of the optical power (>95%) is in active guide 1214, this abrupt variation hardly affects the overall optical field. On the other hand, the effective index of passive guide 1216 with 1 µm width is lower than that of active waveguide 1214 (3 µm wide at that point). When the width of taper 1240 increases from 1 µm to 3 µm, the light is transferred to the passive guide 1216. In this power transfer region, the active area of waveguide 1214 underneath taper 1240 is pumped to avoid optical loss.

Light is transferred from waveguide 1216 to waveguide 1218 using taper 1242, which may be, for example about 350 µm in length. In an exemplary embodiment, passive waveguide 1218 is made of 0.24 µm thick InGaAsP ($E_g$= 0.89 eV) sandwiched in two 0.23 µm thick InGaAsP ($E_g$= 1.03 eV) layers. Guide 1218 is doped with Si at $1\times10^{18}$ cm$^{-3}$. Light in guide 1218 is evanescently absorbed by photodiode 1220. In an exemplary embodiment, diode 1220 comprises an InGaAs ($E_g$=0.75 eV) layer that is approximately 0.6 µm thick. Another 0.6 µm InP cladding layer and 0.1 µm InGaAsP ($E_g$=1.03 eV) contact layer cap the diode. The layers are doped with Be at $1\times10^{18}$ cm$^{-3}$ and $4\times10^{18}$ cm$^{-3}$, respectively. In the exemplary embodiment, diode 1220 is 6 µm wide and 25 µm long.

Importantly, the semiconductor optical amplifier detector of FIG. 14 is constructed according to ATG design principles. Accordingly, the modes of light propagating in adjacent waveguides have different effective indices of refraction and tapers are employed to guide light between waveguides.

Thus, an analog/digital wavelength converter has been disclosed. Importantly, the analog/digital wavelength converter is integrated using ATG design principles. Indeed, the SOA detector of FIG. 14 and the tunable laser of FIG. 13 are comprised in the converter employ asymmetric waveguides. Furthermore, these devices are integrated with transport waveguides using asymmetric twin waveguide design principles. Therefore, a PIC has been disclosed comprising devices for amplifying and creating light, devices for detecting light, and devices for propagating and modulating light. These various devices are formed from waveguides having modes with different effective indices propagating therein.

Integrated Array Waveguide Grating (AWG) and Detector Array

Figure 15:
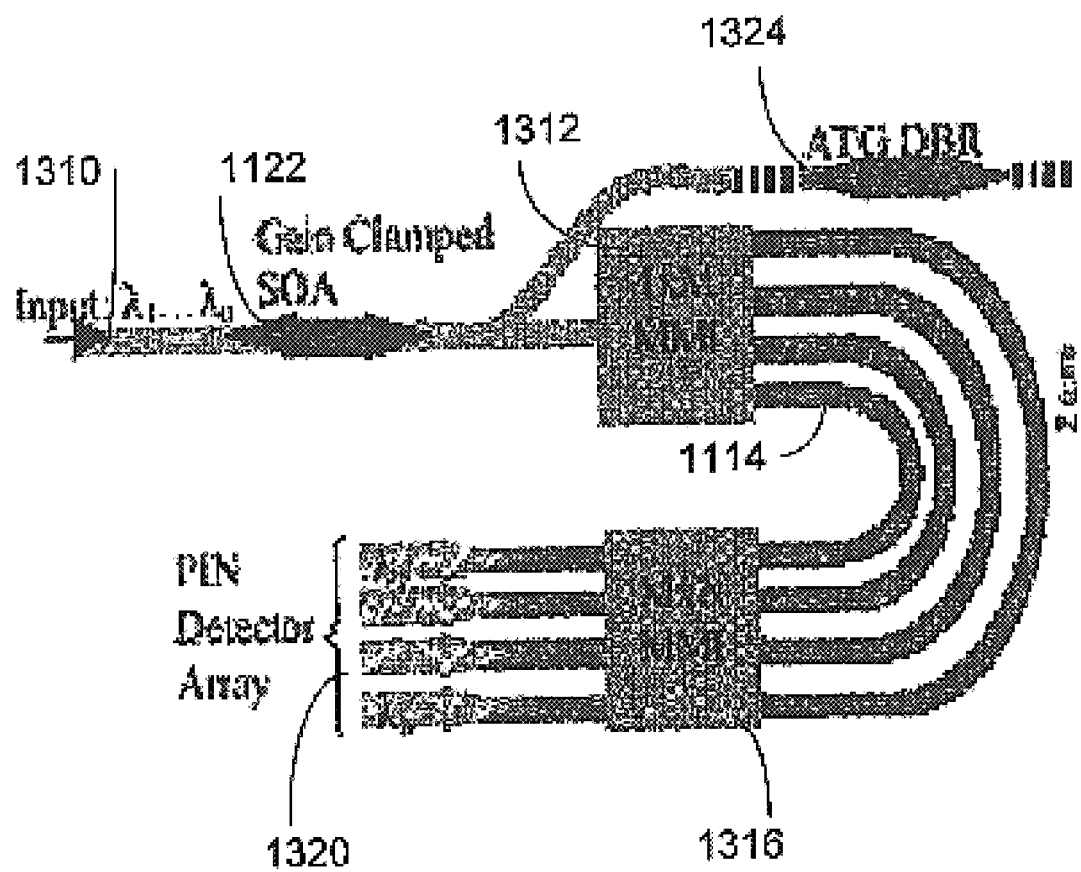
FIG. 15 is a schematic diagram of an integrated waveguide grating and detector array incorporating asymmetric waveguides.

An AWG is a highly versatile device useful for numerous functions in a WDM system. One such application is for the detection of a particular wavelength channel in a WDM link. FIG. 15 provides a schematic diagram of an AWG implemented using ATG design principles. As shown, the AWG has a single input port 1310, which receives N wavelength channels. The wavelength channels are then mixed by a 1×M coupler 1312, and distributed into an array of M waveguides 1314 of different lengths. These waveguides terminate at a second, M×N coupler 1316, with a linear array 1320 of N photodiodes at the output. Prior AWGs employed silica waveguides, and cannot be integrated onto a monolithic semiconductor platform, requiring hybrid, multichip solutions to realize advanced WDM applications. Further, given the low refractive index of silica, the waveguide bends tend to be gentle, resulting in AWG dimensions of ~5 mm. However, the ATG integration platform, employing very low loss circular or right angle bends eliminates both of these limitations, and allows for a very compact grating to be fully integrated with both detection and gain elements.

The difference in path length of the different channels of the MMI introduces phase differences at the input of the second MMI. If the path lengths (radii of circular bends) are chosen carefully one can direct different wavelengths to different output ports of the second MMI.

Referring back to FIG. 15, the ATG platform allows for the integration of an array of p-i-n detectors 1320 for channel readout. Furthermore, an SOA 1322 is coupled to the front MMI coupler to provide overall transparency and low noise operation of the component. A laser 1324 injects light through the AWG back into SOA 1322 and thereby provides gain clamping. The wavelength of laser 1324 is blue-shifted compared with the signal channel wavelengths. Gain clamping is very desirable in multiwavelength systems as it prevents cross-channel modulation in the SOA, as well as providing some degree of channel equalization. An advantage, once again, of the ATG platform, is that the laser 1324 may have an identical gain region as SOA structure 1322, except that there are mirrors formed by etching gratings onto the surface of the waveguide layer.

Thus, another exemplary PIC has been disclosed that incorporates asymmetric waveguide integration. Specifically, an SOA, a laser, and an array of PIN detectors are communicatively coupled via passive waveguides to form a PIC. Importantly, the waveguides that comprise the various devices are asymmetric waveguides with the modes propagating in each waveguide having different effective indices of refraction. In an exemplary embodiment the PIC may have three waveguide levels: a first level provides the passive waveguides, the second level comprises the SOA/laser active region consisting of a strain balanced MQW region to eliminated polarization sensitivity, and a third waveguide level comprises, or has attached thereto, the InGaAs p-i-n detectors. Thus, the disclosed PIC comprises devices for amplifying and generating light, devices for absorbing and detecting light, and devices for transporting and sorting light.

AWG-Based Channel Selector

A final PIC example demonstrating ATG design principles is a channel selector. FIG. 16A is a schematic of a channel selector circuit architecture. As shown, a single, multiwavelength port 1510 is split into several branches 1512, with each branch connected to a wavelength selector 1514. The wavelength selector may be tuned to detect the desired channels, and replace the remaining channels back onto the transmission fiber.

FIG. 16B illustrates the layout of the channel selector. As shown, the channel selector comprises two AWGs 1520, such as those described above in connection with FIG. 16, connected in series. A single waveguide coupled to the input fiber supplies channels 1-N to a first channel selector. The second AWG recombines the demultiplexed channels back into the output waveguide (and fiber). By switching off one or more SOAs 1526 that are located between the input and output AWGs, various wavelength channels can be either passed or dropped before being transmitted at the output. SOAs 1526 may be, for example, similar to those described above in connection with FIG. 12. This wavelength selector is very useful in WDM architectures where different wavelengths must be routed along different paths. As in the case of the AWG receiver, the SOAs provide gain, and hence transparency to the entire network. An array of SOA-PIN detectors 1528 provides a readout.

Thus, the disclosed channel selector provides another exemplary embodiment of a PIC incorporating ATG design principles. The channel selector comprises SOAs, SOA-PIN detectors, and passive waveguides integrated into a single PIC. Thus, the PIC comprises devices for generating and amplifying light, devices for absorbing and detecting light, and devices for transporting light. These devices are formed and integrated together via layers of asymmetric waveguides. Of course, in accordance with ATG design principles, the modes of light propagating in adjacent waveguides have different effective indices of refraction.

CONCLUSION

Thus, several exemplary PICs incorporating ATG design principles have been disclosed. Specifically, a digital wavelength converter, an analog wavelength converter, an array waveguide grating and detector array, and channel selector have been disclosed. The disclosed PIC devices illustrate the combination of different devices into a single substrate to perform a desired function. Specifically, devices for generating and amplifying light, devices for absorbing and detecting light, and devices for transporting and modulating light have been combined into PICs to achieve desired functionality. The devices comprise vertically stacked waveguides, wherein the waveguides have modes propagating therein with different indices of refraction. This characteristic provides relative isolation between waveguides and facilitates the specialization of device functions. Taper sections may be formed in the waveguides to facilitate movement of light between waveguides.

PICs employing ATG design principles are robust, versatile, and commercially viable. Photonic devices and circuits implemented using asymmetric waveguide design principles do not typically require regrowth during the manufacturing process. This allows for standardization of wafer designs and fabrication processes. Furthermore, photonic devices and circuits implemented using asymmetric design principles may be defined on a wafer or chip simply by etching to the various levels between the passive, active and detector waveguide layers. As a result, arbitrary photonic circuits can be defined on the same wafer simply by locally varying the mask levels as required.

While the invention has been described and illustrated with reference to specific embodiments, those skilled in the art will recognize that modification and variations may be made without departing from the principles of the invention as described above and set forth in the following claims. For example, while four exemplary devices have been disclosed, other PIC devices likewise may be developed that incorporate ATG design principles. Indeed, alternative embodiments of the exemplary devices are envisioned. Accordingly, reference should be made to the appended claims as indicating the scope of the invention.

What is claimed is:

1. A photonic integrated circuit, comprising:

a first waveguide for propagating a first mode of light; and a second waveguide for propagating a second mode of light, said second waveguide having at least one taper formed therein for communicating light between said first waveguide and said second waveguide, wherein said first mode of light has a different effective index of refraction from said second mode of light, and wherein each of said first waveguide and said second waveguide operate to perform at least one of generating light, detecting light, and transporting light.

2. The photonic integrated circuit of claim 1, wherein the photonic integrated circuit comprises at least one of the following: a digital wavelength converter, an optical Fredkin logic gate, an analog digital converter, an array waveguide grating, and a channel selector.

3. A phontonic integrated circuit, comprising:

a first optical coupler;

a first waveguide operably coupled to said first optical coupler for propagating light to and from said first optical coupler;

a second waveguide operably coupled to said first optical coupler for propagating light to and from said first optical coupler;

a third waveguide having a first end operably coupled to said first optical coupler and a second end operably coupled to said first optical coupler, said third waveguide for propagating light received at said first end from said first optical coupler to said second end and back into said first coupler, and for propagating light received at said second end from said optical coupler to said first end and back into said first coupler;

a fourth waveguide for propagating primarily a first mode of light and integrally formed with said third waveguide, said forth waveguide having at least one lateral taper formed therein for moving light between said third waveguide and said fourth waveguide, said first mode of light having a different index of refraction than light propagating in said third waveguide;

a gain region integrally formed with said fourth waveguide for amplifying light propagating in said fourth waveguide; and a second optical coupler integrally formed with said third waveguide for transmitting a control signal into said third waveguide.

4. The photonic integrated circuit of claim 3, wherein said fourth waveguide is formed with said third waveguide at a location offset from the center of said third waveguide.

5. The photonic integrated circuit of claim 3, wherein upon an optical signal being propagated into said first optical coupler from said first waveguide, an optical signal is propagated out of said first optical coupler into said first waveguide.

6. The photonic integrated circuit of claim 3, wherein upon an optical signal being propagated into said first optical coupler from said second waveguide, an optical signal is propagated out of said first optical coupler into said second waveguide.

7. The photonic integrated circuit of claim 3, wherein upon an optical signal being propagated into said first optical coupler from said first waveguide, and an optical signal being propagated from said second optical coupler into said third waveguide, a signal is propagated from said first optical coupler on said second waveguide.

8. The photonic integrated circuit of claim 3, wherein upon an optical signal being propagated into said first optical coupler from said second waveguide, and an optical signal being propagated from said second optical coupler into said third waveguide, a signal is propagated from said first optical coupler on said first waveguide.

9. The photonic integrated circuit of claim 3, wherein said photonic integrated circuit comprises a logic gate.

10. The photonic integrated circuit of claim 3, further comprising a fifth waveguide operably coupled to said second optical coupler, wherein light propagating on said fifth waveguide into said second optical coupler causes light to be coupled into said third waveguide.

11. The photonic integrated circuit of claim 10, wherein in response to light having a first wavelength propagating from said first waveguide into said first optical coupler, and light having a second wavelength propagating from said fifth waveguide into said second optical coupler, light having said first wavelength propagates out of said first optical coupler in said second waveguide.

12. The photonic integrated circuit of claim 11, wherein said photonic integrated circuit comprises a wavelength converter.

13. A photonic detector device, comprising:
a first waveguide for guiding primarily a first mode of light;
a second waveguide having a gain region formed therein, said second waveguide for guiding primarily a second mode of light and positioned vertically relative to said first waveguide, wherein said first mode of light has an effective index of refraction different from that of said second mode of light;
a third waveguide for guiding primarily a third mode of light, said third waveguide positioned vertically relative to said second waveguide and separated from said first waveguide by said second waveguide, wherein said third mode of light has an effective index of refraction different from said second mode of light, and wherein said third waveguide and said second waveguide have a first taper formed therein, said first taper for guiding said first mode of light substantially between said first waveguide and said second waveguide, and wherein said third waveguide has a second taper formed therein for guiding said second mode of light between said second waveguide and said third waveguide;
at least one further waveguide for guiding primarily a fourth mode of light, said further waveguide positioned vertically relative to said third waveguide and separated from said second waveguide by said third waveguide, wherein said further waveguide has a lateral taper formed therein for guiding said third mode of light between said third waveguide and said further waveguide and wherein said fourth mode of light has an effective index of refraction different from that of said third mode of light; and
a photo-detector for detecting light propagating in said further waveguide, said photo-detector positioned vertically relative to said further waveguide and being separated from said second waveguide by said further waveguide.

14. The detector of claim 13, wherein said second waveguide comprises an optical amplifier.

15. The detector of claim 13, wherein said photodetector is a PIN device.

16. A photonic device, comprising:
a first waveguide for guiding primarily a first mode of light, said first waveguide having a gain region formed therein for amplifying light propagating in said first waveguide;
a second waveguide for guiding primarily a second mode of light, said second waveguide having a phase tuning region formed therein for isolating a phase of light, said second waveguide positioned vertically relative to said first waveguide, wherein said first waveguide has a lateral taper formed therein for transferring said first mode of light between said first waveguide and said second waveguide and wherein said first mode of light has an effective index of refraction different from that of said second mode of light.

17. The photonic device of claim 16, wherein said second mode of light has an effective index of refraction less than that of said first mode of light.

18. The photonic device of claim 16, wherein said first waveguide is positioned vertically on top of said second waveguide.

19. The photonic device of claim 16, wherein said gain region comprises a multi-quantum well region.

20. The photonic device of claim 16, wherein said second waveguide further comprises a grating for reflecting predominantly one frequency of light.

21. The photonic device of claim 16, wherein an ion implantation region is formed in said second waveguide beween said phase tuning region and said grating.

22. The photonic device of claim 16, wherein said second waveguide has at least one shoulder region formed therein.

23. The photonic device of claim 22, wherein said second waveguide has electrical contacts formed on said shoulder region.

24. The device of claim 16, wherein said first waveguide comprises a distributed feedback (DFB) laser.

25. A photonic integrated circuit, comprising:
a first waveguide for guiding primarily a first mode of light having a plurality of wavelengths therein;
a second waveguide for guiding primarily a second mode of light, said second waveguide having a gain region formed therein for amplifying light propagating therein, said second waveguide positioned vertically relative to said first waveguide and having a taper region formed therein for moving light between said first waveguide and said second waveguide, said second mode of light having a different index of refraction from said first mode of light
a one to many optical coupler operably formed with said first waveguide;
a first array of waveguides operably formed to said one to many optical coupler, each waveguide of said array of waveguides having a different length, wherein each of the plurality of wavelengths propagating in said first waveguide is propagates out of said one to many optical coupler onto one of said waveguides in said array of waveguides;
a many to many optical coupler operably formed with said array of waveguides; and
a second array of waveguides operably coupled to an output of said many to many optical coupler, wherein each waveguide of said second array of waveguides has a mode of light propagating therein and has a further waveguide positioned vertically relative thereto having a different mode of light propagating therein and having a taper formed therein for moving light between waveguides, each said further waveguide having a photodetector positioned vertically relative thereto for detecting light propagating in said further waveguide.

26. A photonic integrated circuit, comprising:
   a first photonic device comprising at least a first waveguide having a first mode of light propagating therein;
   a second photonic device comprising at least a second waveguide having a second mode of light propagating therein; and
   at least a third waveguide with said first and second waveguide, said at least third waveguide having a third mode of light propagating therein,
   wherein said first mode of light, said second mode of light, and said third mode of light have different effective indices of refraction.

27. The photonic integrated circuit of claim 26, wherein said first waveguide and said second waveguide comprise taper sections for facilitating movement of light.

28. The photonic integrated circuit of claim 26, wherein said first, second, and third waveguide are vertically stacked relative to each other.

29. The photonic integrated circuit of claim 26, wherein said first photonic device operates to amplify light, and said second photonic device operates to absorb light.

30. The photonic integrated circuit of claim 29, wherein said first devices is a semiconductor optical amplifier, and said second photonic device is a photo-detector.

31. The photonic integrated circuit of claim 26, wherein the photonic integrated circuit comprises at least one of the following: a digital wavelength converter, an analog digital converter, an array wave grating, and a channel selector.

32. A photonic integrated circuit, comprising:
   a first waveguide having a first mode of light propagating therein, said first waveguide comprised in a first photonic device;
   a second waveguide having a second mode of light propagating therein, said second waveguide comprised in a second photonic device;
   at least a third waveguide having a third mode of light propagating therein,
   wherein light is coupled between said first waveguide and said third waveguide, and between said third waveguide and said second waveguide, and
   said first, second, and third mode of light have different effective indices of refraction.

33. The photonic integrated circuit of claim 32, wherein said first waveguide and said second waveguide comprise taper sections for facilitating movement of light.

34. The photonic integrated circuit of claim 32, wherein said first, second, and third waveguide are vertically stacked relative to each other.

35. The photonic integrated circuit of claim 32, wherein said first photonic device operates to amplify light, and said second photonic device operates to absorb light.

36. The photonic integrated circuit of claim 35, wherein said first devices is a semiconductor optical amplifier, and said second photonic device is a photo-detector.

37. The photonic integrated circuit of claim 32, wherein the photonic integrated circuit comprises at least one of the following: a digital wavelength converter, an analog digital converter, an array wave grating, and a channel selector.

38. A photonic integrated circuit, comprising:
   a first photonic device having at least a first waveguide with substantially one mode of light propagating therein, said first waveguide communicating light with a second waveguide having a second mode of light propagating therein, said first and second modes of light being different; and
   a second photonic device having a third waveguide with substantially a third mode of light propagating therein, said third waveguide communicating light with a fourth waveguide having a fourth mode of light propagating therein, said third and fourth modes of light being different;
   wherein said first and second photonic device are formed on the same substrate and light from said first photonic device is communicated to said second photonic device.

39. The photonic integrated circuit of claim 38, wherein said first waveguide and said third waveguide have taper sections formed therein for facilitating movement of light.

40. The photonic integrated circuit of claim 38, wherein at least one of said first and said third waveguides have a gain region formed therein.

41. The photonic integrated circuit of claim 38, wherein at least one of said first and said third waveguides have a detector region formed therein.

42. The photonic integrated circuit of claim 38, wherein said second and fourth waveguide are the same waveguide and said second and fourth modes are the same mode.

43. The photonic integrated circuit of claim 38, wherein said first photonic device is an optical amplifier and said second device is a photo-detector.

44. The photonic integrated circuit of claim 38, wherein said second and fourth waveguides communicate light between photonic devices comprised in the integrated circuit.

45. A laser, comprising:
   a first waveguide having a first mode of light propagating therein;
   a second waveguide vertically positioned above said first waveguide and having a second mode of light propagating therein, said second waveguide having a gain region formed therein and having a taper section for communicating light between said first waveguide and said second waveguide;
   a barrier region formed above said second waveguide, said barrier region forming a ridge along the length of said second waveguide;
   a first grating region formed in said barrier region on a first side of said ridge; and
   a second grating region formed in said barrier region of a second side of said ridge, wherein said first grating region and second grating region reflect primarily one frequency of light,
   wherein said first and second modes of light have different effective indices of refraction.

* * * * *